United States Patent
Nishiuchi et al.

(10) Patent No.: US 8,569,787 B2
(45) Date of Patent: Oct. 29, 2013

(54) LIGHT SOURCE APPARATUS USING SEMICONDUCTOR LIGHT EMITTING DEVICE

(75) Inventors: Hideo Nishiuchi, Hyogo-ken (JP); Kazuhito Higuchi, Kanagawa-ken (JP); Susumu Obata, Kanagawa-ken (JP); Toshiya Nakayama, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 323 days.

(21) Appl. No.: 13/154,916

(22) Filed: Jun. 7, 2011

(65) Prior Publication Data

US 2011/0297986 A1    Dec. 8, 2011

(30) Foreign Application Priority Data

Jun. 7, 2010   (JP) .................. 2010-130520

(51) Int. Cl.
    *H01L 33/00*   (2010.01)
(52) U.S. Cl.
    USPC .............. 257/99; 257/E33.057; 257/E33.066; 257/E33.075
(58) Field of Classification Search
    USPC .............. 257/99, E33.057, E33.066, E33.075
    See application file for complete search history.

(56) References Cited

U.S. PATENT DOCUMENTS

| | | | | |
|---|---|---|---|---|
| 7,842,959 B2 * | 11/2010 | Lee et al. | .......................... | 257/88 |
| 8,058,639 B2 * | 11/2011 | Inoue et al. | ...................... | 257/13 |
| 2006/0231854 A1 * | 10/2006 | Chae et al. | ........................ | 257/99 |
| 2010/0102354 A1 * | 4/2010 | Hsu | ................... | 257/99 |

FOREIGN PATENT DOCUMENTS

| | | |
|---|---|---|
| JP | 2001-210874 | 8/2001 |
| JP | 2002-64112 | 2/2002 |
| JP | 2002-118293 | 4/2002 |
| JP | 2007-129188 | 5/2007 |
| JP | 2007-527123 | 9/2007 |
| JP | 2008-124243 | 5/2008 |
| JP | 2010-517289 | 5/2010 |
| JP | 2011-29634 | 2/2011 |
| JP | 2011-71272 | 4/2011 |

OTHER PUBLICATIONS

Japanese Office Action issued Jun. 28, 2012 in Patent Application No. 2010-130520 with English Translation.

* cited by examiner

*Primary Examiner* — Daniel Luke
(74) *Attorney, Agent, or Firm* — Oblon, Spivak, McClelland, Maier & Neustadt, L.L.P.

(57) ABSTRACT

According to one embodiment, a light source apparatus includes a semiconductor light emitting device, a mounting substrate, first and second connection members. The semiconductor light emitting device includes a light emitting unit, first and second conductive members, a sealing member, and an optical layer. The mounting substrate includes a base body, first and second substrate electrodes. The connection member electrically connects the conductive member to the substrate electrode. The conductive member is electrically connected to the light emitting unit electrode and includes first and second columnar portions provided on the second major surface. The sealing member covers side surfaces of the first and the second conductive members. The optical layer is provided on the first major surface of the semiconductor stacked body and includes a wavelength conversion unit. A surface area of the second substrate electrode is not less than 100 times a cross-sectional area of the second columnar portion.

20 Claims, 10 Drawing Sheets

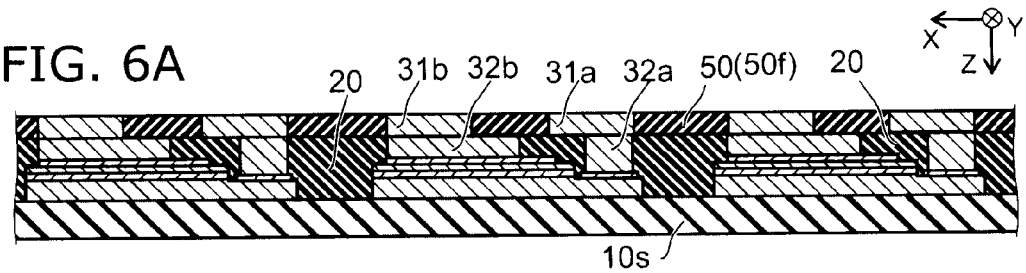
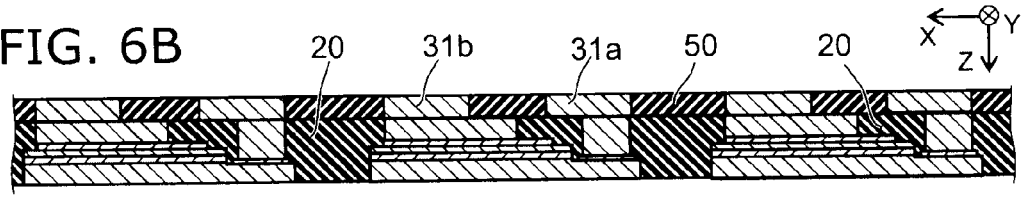
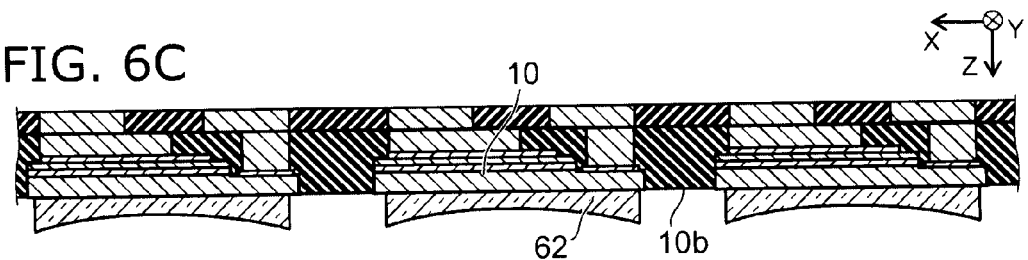
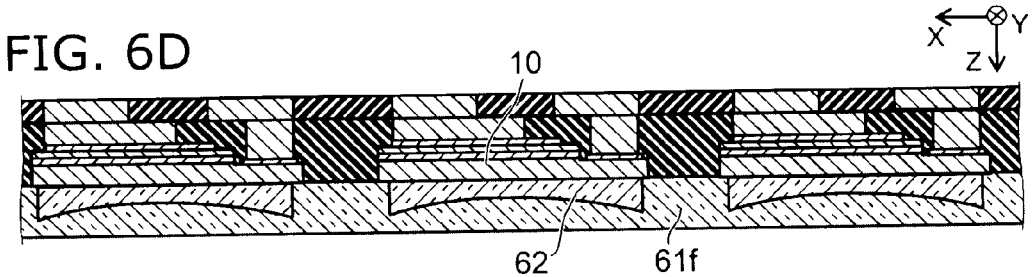
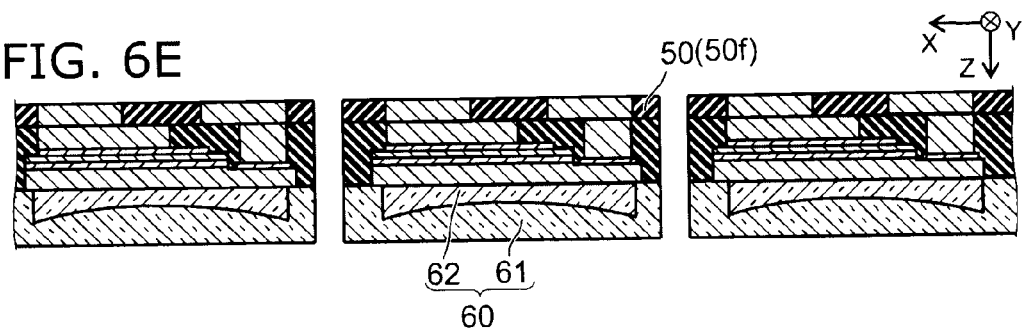

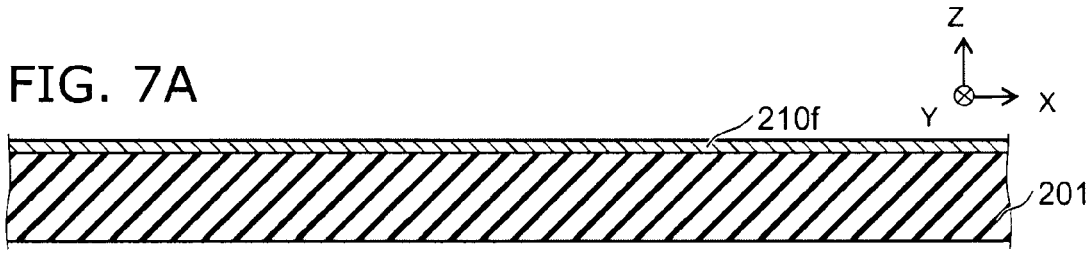
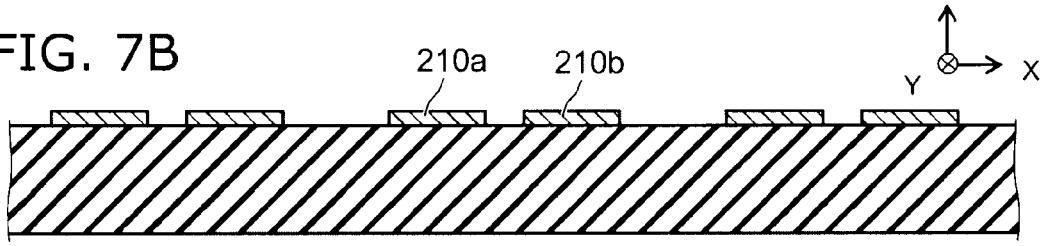
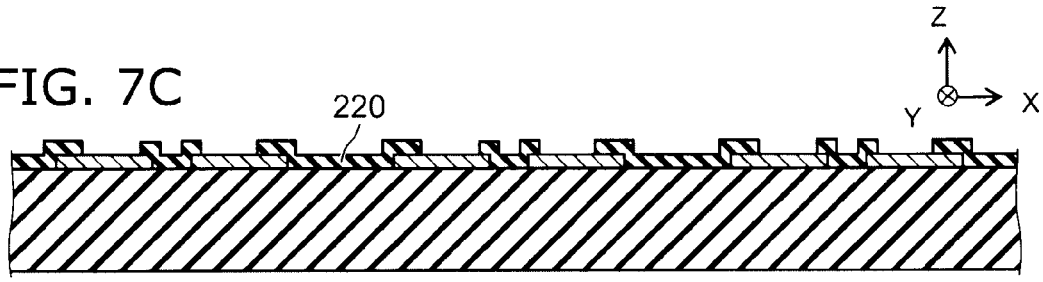
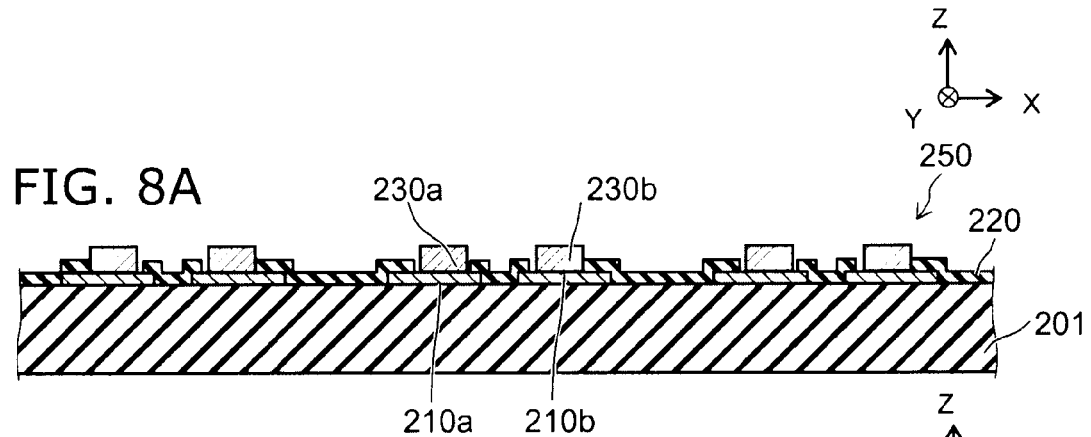
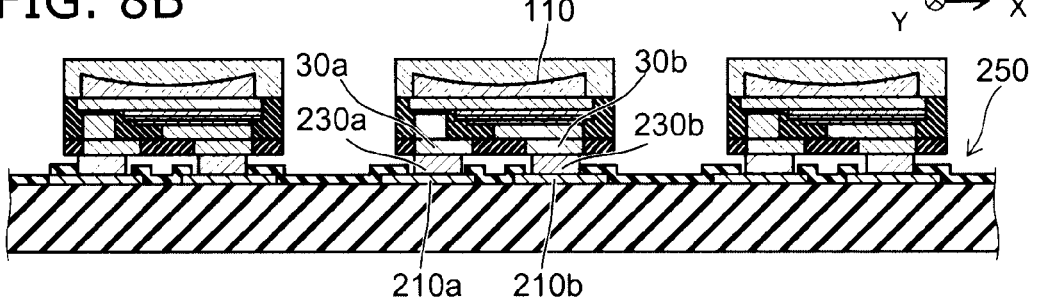

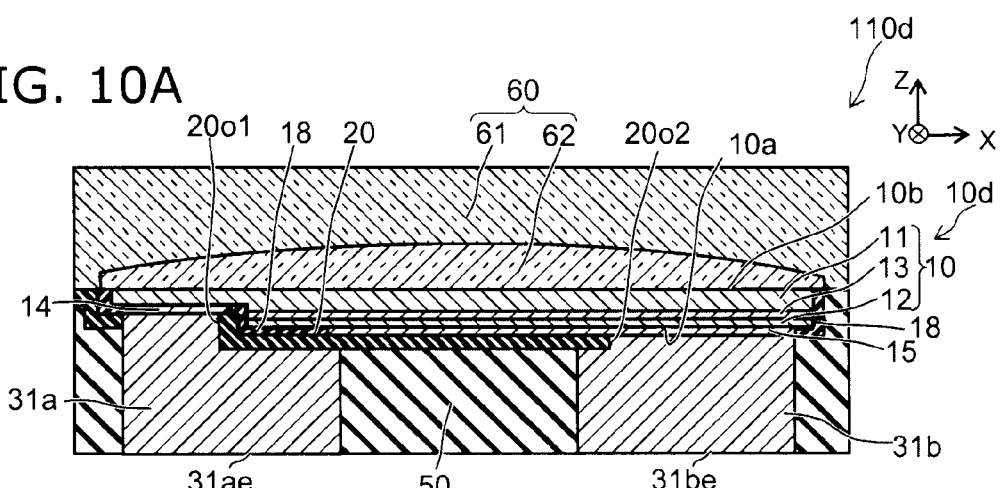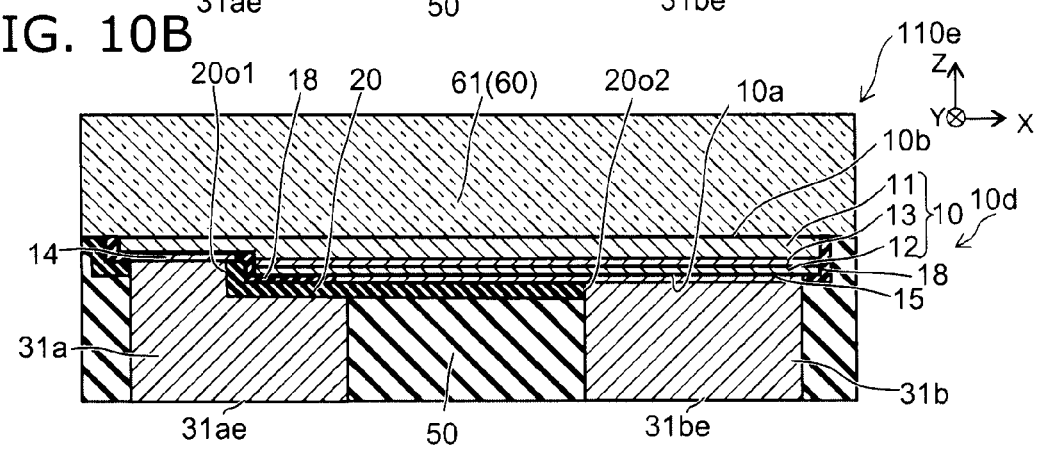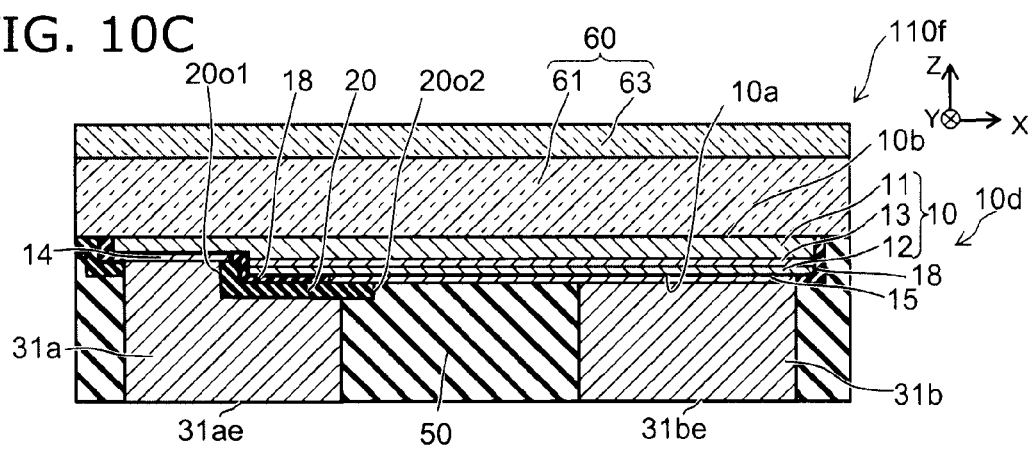

US 8,569,787 B2

LIGHT SOURCE APPARATUS USING SEMICONDUCTOR LIGHT EMITTING DEVICE

CROSS-REFERENCE TO RELATED APPLICATIONS

This application is based upon and claims the benefit of priority from the prior Japanese Patent Application No. 2010-130520, filed on Jun. 7, 2010; the entire contents of which are incorporated herein by reference.

FIELD

Embodiments described herein relate generally to a light source apparatus using a semiconductor light emitting device.

BACKGROUND

White LED (Light Emitting Diode) light emitting devices, which emit white light by a combination of a fluorescer and a light emitting unit such as a blue LED, have been developed as small and low power-consumption light emitting devices.

For example, a known semiconductor light emitting device has a configuration in which a fluorescer is coated onto an LED chip surface after the LED chip is die bonded to a leadframe or a conductive substrate and wire bonding is performed. However, in such a semiconductor light emitting device, the device is large and downsizing is impeded because members other than the LED chip such as the leadframe, the conductive substrate, the bonding wires, etc., are necessary.

To increase the luminous efficiency, it is particularly important to realize high heat dissipation in a light source apparatus that uses a downsized light emitting unit.

BRIEF DESCRIPTION OF THE DRAWINGS

FIG. 6A to FIG. 6E are schematic cross-sectional views in order of the processes, illustrating a method for manufacturing the semiconductor light emitting device used in the light source apparatus according to the embodiment;

FIG. 7A to FIG. 7C are schematic cross-sectional views in order of the processes, illustrating a method for manufacturing the mounting substrate used in the light source apparatus according to the embodiment;

FIG. 8A and FIG. 8B are schematic cross-sectional views in order of the processes, illustrating a method for manufacturing the light source apparatus according to the embodiment;

FIG. 10A to FIG. 10C are schematic cross-sectional views illustrating the configuration of other semiconductor light emitting devices used in the light source apparatus according to the embodiment.

DETAILED DESCRIPTION

Figure 1A:
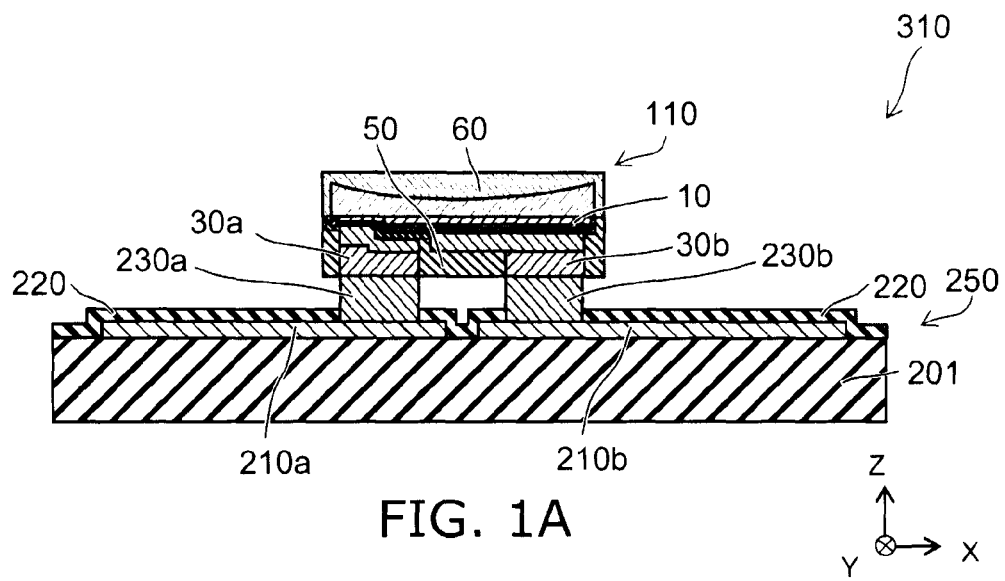
FIG. 1A and FIG. 1B are schematic views illustrating the configuration of a light source apparatus according to an embodiment.

In general, according to one embodiment, a light source apparatus includes a semiconductor light emitting device, a mounting substrate, a first connection member, and a second connection member. The semiconductor light emitting device includes a light emitting unit, a first conductive member, a second conductive member, a sealing member, and an optical layer. The mounting substrate includes a base body, a first substrate electrode, and a second substrate electrode. The first substrate electrode and the second substrate electrode are provided on a surface of the base body to oppose the semiconductor light emitting device. The first connection member is configured to electrically connect the first conductive member to the first substrate electrode. The second connection member is configured to electrically connect the second conductive member to the second substrate electrode. The light emitting unit includes a semiconductor stacked body, a first light emitting unit electrode, a second light emitting unit electrode. The semiconductor stacked body includes a first semiconductor layer of a first conductivity type, a second semiconductor layer of a second conductivity type, and a light emitting layer provided between the second semiconductor layer and a portion of the first semiconductor layer. The semiconductor stacked body has a first major surface on a first semiconductor layer side of the semiconductor stacked body and a second major surface on a second semiconductor layer side of the semiconductor stacked body. The first light emitting unit electrode is electrically connected to the first semiconductor layer on a second major surface side. The second light emitting unit electrode is electrically connected to the second semiconductor layer on the second major surface side. The first conductive member is electrically connected to the first light emitting unit electrode and includes a first columnar portion provided on the second major surface. The second conductive member is electrically connected to the second light emitting unit electrode and includes a second columnar portion provided on the second major surface. The sealing member covers a side surface of the first conductive member and a side surface of the second conductive member. The optical layer is provided on the first major surface of the semiconductor stacked body. The optical layer includes a wavelength conversion unit. The wavelength conversion unit is configured to absorb an emitted light emitted from the light emitting layer and emit a light having a wavelength different from a wavelength of the emitted light. A surface area of the second substrate electrode is not less than 100 times a cross-sectional area of the second columnar portion cut by a plane parallel to the second major surface.

In general, according to another embodiment, a light source apparatus includes a semiconductor light emitting device, a mounting substrate, a first connection member, and a second connection member. The semiconductor light emitting device includes a light emitting unit, a first conductive member, a second conductive member, a sealing member, and an optical layer. The mounting substrate includes a base body, a first substrate electrode, and a second substrate electrode. The first substrate electrode and the second substrate electrode are provided on a surface of the base body to oppose the semiconductor light emitting device. The first connection member is configured to electrically connect the first conductive member to the first substrate electrode. The second connection member is configured to electrically connect the second conductive member to the first substrate electrode. The light emitting unit includes a semiconductor stacked body, a first light emitting unit electrode, and a second light emitting unit electrode. The semiconductor stacked body includes a first semiconductor layer of a first conductivity type, a second semiconductor layer of a second conductivity type, and a light emitting layer provided between the second semiconductor layer and a portion of the first semiconductor layer. The semiconductor stacked body has a first major surface on a first semiconductor layer side of the semiconductor stacked body and a second major surface on a second semiconductor layer side of the semiconductor stacked body. The first light emitting unit electrode is electrically connected to the first semiconductor layer on a second major surface side. The second light emitting unit electrode is electrically connected to the second semiconductor layer on the second major surface side. The first conductive member is electrically connected to the first light emitting unit electrode and includes a first columnar portion provided on the second major surface. The second conductive member is electrically connected to the second light emitting unit electrode and includes a second columnar portion provided on the second major surface. The sealing member covers a side surface of the first conductive member and a side surface of the second conductive member. The optical layer is provided on the first major surface of the semiconductor stacked body. The optical layer includes a wavelength conversion unit. The wavelength conversion unit is configured to absorb an emitted light emitted from the light emitting layer and emit a light having a wavelength different from a wavelength of the emitted light. The surface area of the second substrate electrode is not less than 30 times a cross-sectional area of the light emitting unit cut by a plane parallel to the second major surface.

Various embodiments will be described with reference to the accompanying drawings.

The drawings are schematic or conceptual; and the relationships between the thickness and width of portions, the proportions of sizes among portions, etc., are not necessarily the same as the actual values thereof. Further, the dimensions and the proportions may be illustrated differently among the drawings, even for identical portions.

In the specification and the drawings of the application, components similar to those described in regard to a drawing thereinabove are marked with like reference numerals, and a detailed description is omitted as appropriate.

Embodiments

Figure 1B:
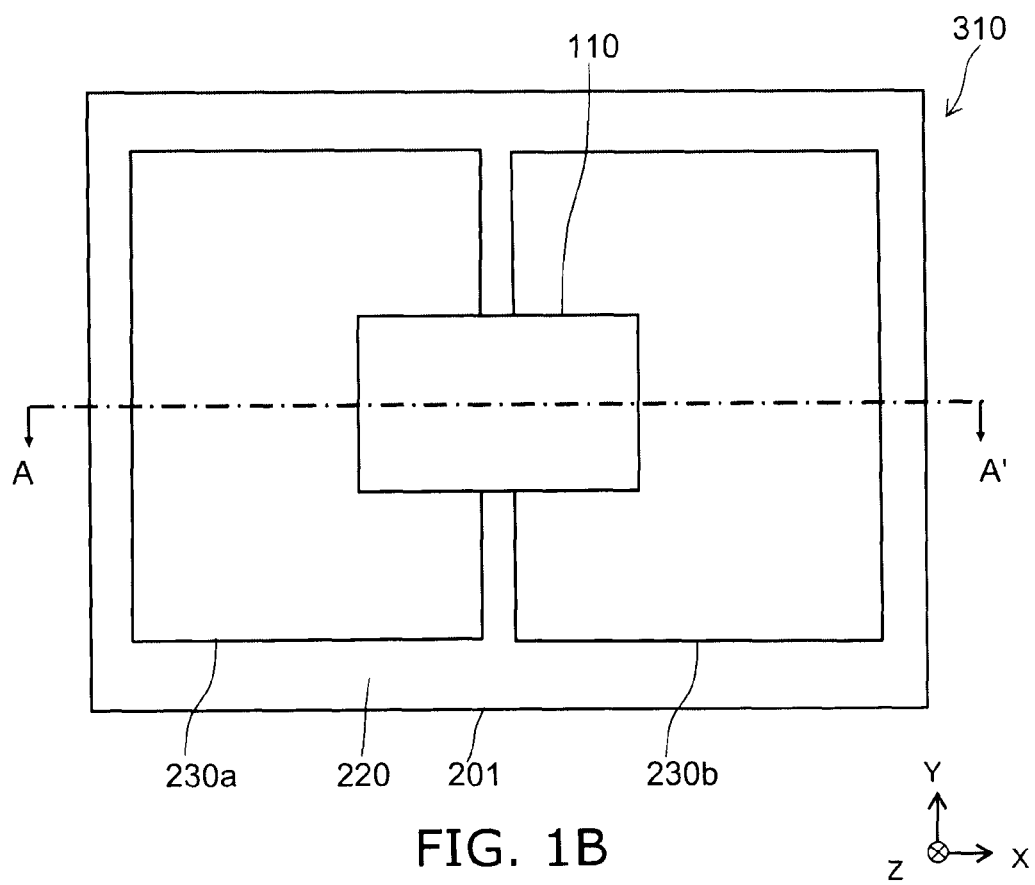

FIG. 1A and FIG. 1B are schematic views illustrating the configuration of a light source apparatus according to the embodiment.

Namely, FIG. 1B is a schematic plan view; and FIG. 1A is a cross-sectional view along line A-A' of FIG. 1B.

Figure 2A:
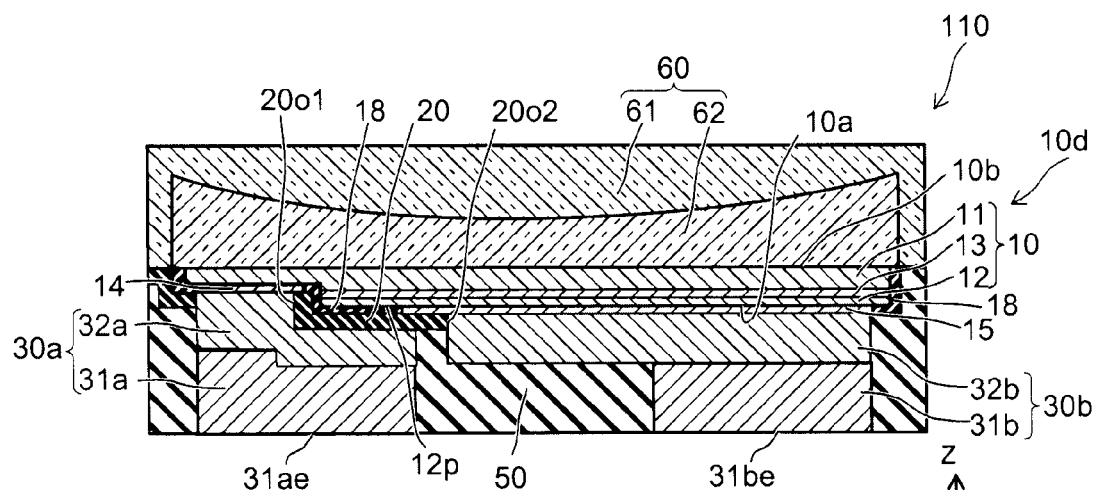
FIG. 2A and FIG. 2B are schematic views illustrating the configuration of a semiconductor light emitting device used in the light source apparatus according to the embodiment.
Figure 2B:
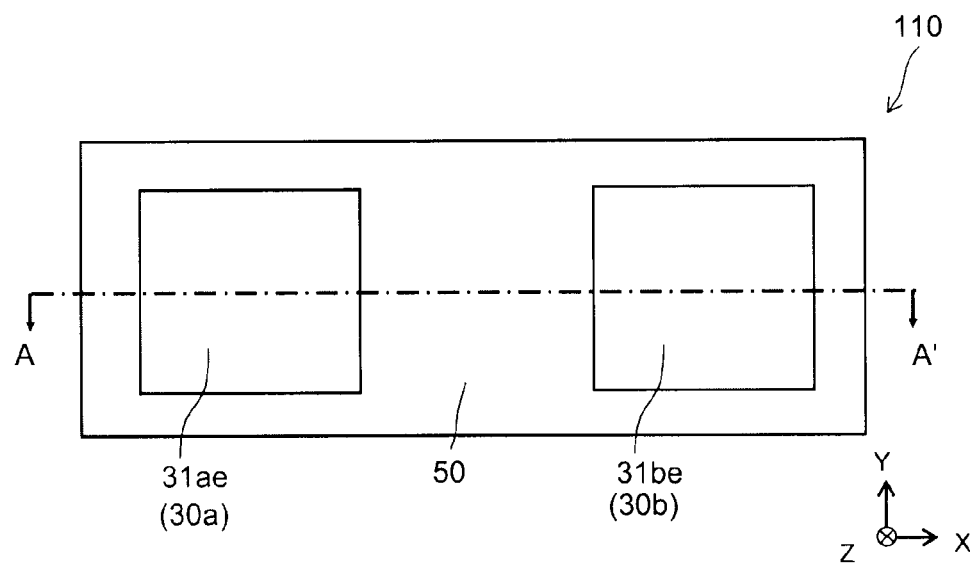

FIG. 2A and FIG. 2B are schematic views illustrating the configuration of a semiconductor light emitting device used in the light source apparatus according to the embodiment.

Namely, FIG. 2B is a schematic plan view; and FIG. 2A is a cross-sectional view along line A-A' of FIG. 2B.

As illustrated in FIG. 1A and FIG. 1B, the light source apparatus 310 according to the embodiment includes a semiconductor light emitting device 110, a mounting substrate 250, a first connection member 230a, and a second connection member 230b.

The semiconductor light emitting device 110 includes a light emitting unit 10d, a first conductive member 30a, a second conductive member 30b, a sealing member 50, and an optical layer 60.

The mounting substrate 250 includes a base body 201, a first substrate electrode 210a, and a second substrate electrode 210b. The first substrate electrode 210a and the second substrate electrode 210b are provided on the surface of the base body 201 to oppose the semiconductor light emitting device 110.

The first connection member 230a electrically connects the first conductive member 30a to the first substrate electrode 210a. The first connection member 230a electrically connects the second conductive member 30b to the second substrate electrode 210b.

As illustrated in FIG. 2A and FIG. 2B, the light emitting unit 10d includes a semiconductor stacked body 10, a first light emitting unit electrode 14, and a second light emitting unit electrode 15.

The semiconductor stacked body 10 includes a first semiconductor layer 11 of a first conductivity type, a second semiconductor layer 12 of a second conductivity type, and a light emitting layer 13 provided between the first semiconductor layer 11 and the second semiconductor layer 12. A portion of the first semiconductor layer 11 is exposed at a second major surface 10a of the semiconductor stacked body 10 on the second semiconductor layer 12 side by the second semiconductor layer 12 and the light emitting layer 13 being selectively removed.

In other words, the semiconductor stacked body 10 has a first major surface 10b and the second major surface 10a on the side opposite to the first major surface 10b. The second semiconductor layer 12 is disposed on the second major surface 10a side; and the first semiconductor layer 11 is disposed on the first major surface 10b side.

Thus, the light emitting layer 13 is provided between the second semiconductor layer 12 and a portion of the first semiconductor layer 11. The semiconductor stacked body 10 has the first major surface 10b on the first semiconductor layer 11 side of the semiconductor stacked body 10 and the second major surface 10a on the second semiconductor layer 12 side of the semiconductor stacked body 10.

For example, the surface areas of the second semiconductor layer 12 and the light emitting layer 13 are less than the surface area of the first semiconductor layer 11; and a portion of the first semiconductor layer 11 on the second major surface 10a side is not covered with the second semiconductor layer 12 and the light emitting layer 13.

The first conductivity type is, for example, an n-type. The second conductivity type is, for example, a p-type. However, the embodiment is not limited thereto. The first conductivity type may be the p-type; and the second conductivity type may be the n-type. Hereinbelow, the case is described where the first conductivity type is the n-type and the second conductivity type is the p-type. In other words, the first semiconductor layer 11 is an n-type semiconductor layer. The second semiconductor layer 12 is a p-type semiconductor layer.

The first semiconductor layer 11, the second semiconductor layer 12, and the light emitting layer 13 may include, for example, a nitride semiconductor. The first semiconductor layer 11 is, for example, an n-type cladding layer including GaN. The second semiconductor layer 12 is, for example, a p-type cladding layer. The light emitting layer 13 includes, for example, a quantum well layer and a barrier layer stacked with the quantum well layer. The light emitting layer 13 may have, for example, a single quantum well structure or a multiple quantum well structure.

Herein, a direction from the second major surface 10a toward the first major surface 10b is taken as a Z-axis direction. In other words, the Z-axis direction is the stacking direction of the first semiconductor layer 11, the light emitting layer 13, and the second semiconductor layer 12. One direction perpendicular to the Z-axis direction is taken as an X-axis direction. A direction perpendicular to the Z-axis direction and the X-axis direction is taken as a Y-axis direction.

In the specific example, the direction of the side of the semiconductor stacked body 10 along the direction from a first columnar portion 31a toward a second columnar portion 31b described below is set to be in the X-axis direction.

The semiconductor stacked body 10 is formed by, for example, sequentially growing a crystal used to form the first semiconductor layer 11, a crystal used to form the light emitting layer 13, and a crystal used to form the second semiconductor layer 12 on a substrate such as sapphire and by subsequently removing the second semiconductor layer 12, the light emitting layer 13, and a portion of the first semiconductor layer 11 in a prescribed region.

The first light emitting unit electrode 14 is electrically connected to the first semiconductor layer 11 on the second major surface 10a side. The second light emitting unit electrode 15 is electrically connected to the second semiconductor layer 12 on the second major surface 10a side.

The first light emitting unit electrode 14 is, for example, an n-side electrode; and the second light emitting unit electrode 15 is, for example, a p-side electrode. Light (an emitted light) is emitted from the light emitting layer 13 of the light emitting unit 10d by supplying a current to the semiconductor stacked body 10 via the first light emitting unit electrode 14 and the second light emitting unit electrode 15.

Thus, the light emitting unit 10d includes the first major surface 10b, the second major surface 10a on the side opposite to the first major surface 10b, and the first light emitting unit electrode 14 and the second light emitting unit electrode 15 provided on the second major surface 10a.

The first conductive member 30a is electrically connected to the first light emitting unit electrode 14. The first conductive member 30a includes the first columnar portion 31a provided on the second major surface 10a. The second conductive member 30b is electrically connected to the second light emitting unit electrode 15. The second conductive member 30b includes the second columnar portion 31b provided on the second major surface 10a.

The sealing member 50 covers the side surface of the first conductive member 30a and the side surface of the second conductive member 30b.

The optical layer 60 is provided on the first major surface 10b on the side of the semiconductor stacked body 10 opposite to the second major surface 10a. The optical layer 60 includes a fluorescer layer 61 (a wavelength conversion unit). The fluorescer layer 61 is configured to absorb the emitted light emitted from the light emitting layer 13 and emit light having a wavelength different from the wavelength of the emitted light.

As illustrated in FIG. 1A and FIG. 1B, the semiconductor light emitting device 110 and the mounting substrate 250 are stacked along the Z-axis direction. The first conductive member 30a of the semiconductor light emitting device 110 opposes the first substrate electrode 210a of the mounting substrate 250. The second conductive member 30b of the semiconductor light emitting device 110 opposes the second substrate electrode 210b of the mounting substrate 250. The mutually-opposed first conductive member 30a and first substrate electrode 210a are connected by the first connection member 230a. The mutually-opposed second conductive member 30b and second substrate electrode 210b are connected by the second connection member 230b.

The base body 201 of the mounting substrate 250 may include, for example, a glass epoxy resin, a phenol resin, a glass cloth/non-woven glass cloth epoxy resin, a substrate based on a metal such as copper or aluminum, a ceramic, etc. However, the embodiment is not limited thereto. The base body 201 may include any material.

The first substrate electrode 210a and the second substrate electrode 210b may include, for example, copper, aluminum, silver, etc. The thicknesses of the first substrate electrode 210a and the second substrate electrode 210b may be, for example, not less than 10 micrometers ($\mu$m) and not more than 100 $\mu$m. However, the embodiment is not limited thereto. The materials and the thicknesses of the first substrate electrode 210a and the second substrate electrode 210b are arbitrary.

In the specific example, the mounting substrate 250 may further include a mounting substrate insulating layer 220 configured to leave a portion of the second substrate electrode 210b exposed to connect to the second connection member 230b while leaving a portion of the first substrate electrode 210a exposed to connect to the first connection member 230a. The mounting substrate insulating layer 220 may include, for example, polyimide, etc. The mounting substrate insulating layer 220 may be provided if necessary and may be omitted in some cases.

The first connection member 230a and the second connection member 230b may include, for example, a Sn—Ag—Cu-based lead-free solder. However, the embodiment is not limited thereto. The first connection member 230a and the second connection member 230b may include any material.

The surface area of the first substrate electrode 210a and the second substrate electrode 210b of the light source apparatus 310 may be set to be large. Thereby, a light source apparatus that has good heat dissipation and uses a small semiconductor light emitting device can be provided.

For example, the surface area of the second substrate electrode 210b is not less than 100 times the cross-sectional area of the second columnar portion 31b (the cross-sectional area cut by a plane parallel to the second major surface 10a).

The surface area of the first substrate electrode 210a may be set to be not less than 100 times the cross-sectional area of the first columnar portion 31a (the cross-sectional area cut by a plane parallel to the second major surface 10a).

The surface area of the second substrate electrode 210b is not less than 30 times the cross-sectional area of the light emitting unit 10d (the cross-sectional area cut by a plane parallel to the second major surface 10a).

The surface area of the first substrate electrode 210a may be set to be not less than 30 times the cross-sectional area of the light emitting unit 10d (the cross-sectional area cut by a plane parallel to the second major surface 10a).

Effects are described below in which the heat dissipation can be improved by the surface areas of the first substrate electrode 210a and the second substrate electrode 210b being set to be large.

In the specific example, the semiconductor light emitting device 110 further includes an insulating layer 20 provided between the first columnar portion 31a and one portion 12p of the second semiconductor layer 12 on the second major surface 10a side. The first columnar portion 31a covers the one portion 12p of the second semiconductor layer 12 on the second major surface 10a side with the insulating layer 20 interposed. In other words, the first columnar portion 31a is provided on the second major surface 10a while being separate from the second semiconductor layer 12 and covering the one portion 12p of the second semiconductor layer 12 on the second major surface 10a side. The first columnar portion 31a includes at least a portion extending along, for example, the Z-axis direction. The second semiconductor layer 12 and the first columnar portion 31a are electrically cut off from each other by the insulating layer 20.

The insulating layer 20 is not provided on at least a portion of the first light emitting unit electrode 14 to realize the electrical connection between the first conductive member 30a and the first light emitting unit electrode 14. The insulating layer 20 has, for example, a first opening 20o1; and the electrical connection between the first conductive member 30a and the first light emitting unit electrode 14 is performed in the first opening 20o1. The first opening 20o1 may include a hole piercing the insulating layer 20. However, the embodiment is not limited thereto. For convenience, the first opening 20o1 may include the case where the end portion of the insulating layer 20 includes a portion receded from the end portion of the first light emitting unit electrode 14 to expose the first light emitting unit electrode 14. In other words, the first opening 20o1 may include the case where a portion of the insulating layer 20 leaves at least a portion of the first light emitting unit electrode 14 exposed; and the configuration thereof is arbitrary. The number of the first openings 20o1 is arbitrary.

The second columnar portion 31b of the second conductive member 30b includes at least a portion extending along the Z-axis direction.

The insulating layer 20 also leaves at least a portion of the second light emitting unit electrode 15 exposed. Thereby, the electrical connection is performed between the second conductive member 30b and the second light emitting unit electrode 15. In other words, the insulating layer 20 has, for example, a second opening 20o2 on the second light emitting unit electrode 15 side; and the electrical connection between the second conductive member 30b and the second light emitting unit electrode 15 is performed in the second opening 20o2. In such a case as well, the second opening 20o2 may include a hole piercing the insulating layer 20. Also, for convenience, the second opening 20o2 may include the case where a portion is receded from the end portion of the second light emitting unit electrode 15 to expose the second light emitting unit electrode 15. In other words, the second opening 20o2 includes the case where a portion of the insulating layer 20 leaves at least a portion of the second light emitting unit electrode 15 exposed; and the configuration thereof is arbitrary. The number of the second openings 20o2 is arbitrary.

The sealing member 50 leaves a first end surface 31ae of the first conductive member 30a on the side opposite to the semiconductor stacked body 10 exposed. The sealing member 50 also leaves a second end surface 31be of the second conductive member 30b on the side opposite to the semiconductor stacked body 10 exposed. The first end surface 31ae is the end surface of the first columnar portion 31a on the side opposite to the semiconductor stacked body 10. The second end surface 31be is the end surface of the second columnar portion 31b on the side opposite to the semiconductor stacked body 10.

In the specific example, the fluorescer layer 61 includes, for example, the fluorescer layer 61 including a fluorescer and a transparent member 62 provided between the fluorescer layer 61 and the semiconductor stacked body 10. The transparent member 62 is transparent to the light emitted from the light emitting layer 13. The transparent member 62 may have an effect of changing the propagation direction of light such as, for example, a lens effect, a refraction effect, etc. Thereby, the irradiation angle and/or the color shift of the light produced by the light emitting layer 13 can be adjusted. The transparent member 62 may be provided if necessary; and the transparent member 62 can be omitted in some cases.

The fluorescer layer 61 includes, for example, a transparent resin and a fluorescer dispersed in the resin. The fluorescer is configured to absorb the emitted light emitted from the light emitting layer 13 and emit light having a wavelength different from the wavelength of the emitted light. The fluorescer layer 61 may include multiple types of fluorescers. The fluorescer may include, for example, a fluorescer configured to emit any color such as a fluorescer configured to emit yellow light, a fluorescer configured to emit green light, a fluorescer configured to emit red light, etc. The fluorescer layer 61 also may include multiple stacked layers including fluorescers of different wavelengths.

In the semiconductor light emitting device 110, a current is supplied to the semiconductor stacked body 10 via the first conductive member 30a, the first light emitting unit electrode 14, the second conductive member 30b, and the second light emitting unit electrode 15. Thereby, light (the emitted light) is emitted from the light emitting layer 13. The emitted light may be light having a relatively short wavelength such as, for example, blue light, violet light, ultraviolet light, etc.

Blue emitted light, for example, emitted from the light emitting layer 13 propagates through the interior of the optical layer 60 and undergoes wavelength conversion to, for example, yellow light by the fluorescer layer 61. Then, the blue emitted light, for example, emitted from the light emitting layer 13 is synthesized with, for example, the yellow light obtained in the fluorescer layer 61. Thereby, the semiconductor light emitting device 110 can emit white light.

The wavelength of the emitted light emitted from the light emitting layer 13 and the wavelength of the light converted in the fluorescer layer 61 are arbitrary. Other than white, the color of the light emitted from the semiconductor light emitting device 110 may be any color.

In the specific example, the light emitting unit 10d further includes a protective layer 18 provided on the second major surface 10a side of the semiconductor stacked body 10 in a portion excluding the first light emitting unit electrode 14 and the second light emitting unit electrode 15. The protective layer 18 covers the end portion of the semiconductor stacked body 10. The protective layer 18 may include an insulating material. Thereby, the insulative property between the first electrode 14 and the second electrode 15 improves. The protective layer 18 also may cover the entire end portion of the semiconductor stacked body 10. The protective layer 18 also may cover a portion of the end portion of the semiconductor stacked body 10. The protective layer 18 may include, for example, silicon oxide, etc. However, the embodiment is not limited thereto. The protective layer 18 may include any insulating material. The protective layer 18 may be provided if necessary and can be omitted in some cases.

The second light emitting unit electrode 15 may have a stacked structure. For example, the second light emitting unit electrode 15 may include a conductive layer and a reflective layer (not illustrated) provided between the conductive layer and the second semiconductor layer 12. Thereby, the light emitted from the light emitting layer 13 to propagate to the second major surface 10a side is reflected by the reflective layer; and light can propagate efficiently to the optical layer 60 side.

In the specific example, the first conductive member 30a further includes a first connection portion 32a. The first connection portion 32a covers at least a portion of the insulating layer 20 and electrically connects the first light emitting unit electrode 14 to the first columnar portion 31a. The first connection portion 32a may include a portion extending along, for example, the X-Y plane.

The second conductive member 30b may further include a second connection portion 32b. The second connection portion 32b electrically connects the second light emitting unit electrode 15 to the second columnar portion 31b. The second connection portion 32b may include a portion extending along, for example, the X-Y plane.

The first columnar portion 31a, the first connection portion 32a, the second columnar portion 31b, and the second connection portion 32b may include a metal such as, for example, Cu (copper), Ni (nickel), Al (aluminum), etc. However, the embodiment is not limited thereto. The first columnar portion 31a, the first connection portion 32a, the second columnar portion 31b, and the second connection portion 32b may include any material.

The sealing member 50 covers the side surface of the first connection portion 32a, the side surface of the first columnar portion 31a, the side surface of the second connection portion 32b, and the side surface of the second columnar portion 31b. The sealing member 50 may include a resin such as, for example, an epoxy resin. The resin of the sealing member 50 may contain a filler such as, for example, a quartz filler, an alumina filler, etc. Thereby, the thermal conductivity of the sealing member 50 can be increased. Thereby, the heat dissipation can be improved; the temperature increase of the semiconductor stacked body can be suppressed; and the luminous efficiency can be increased.

The insulating layer 20 may include a resin such as, for example, polyimide.

In the semiconductor light emitting device 110, a configuration is employed in which the first columnar portion 31a of the first conductive member 30a covers a portion of the second semiconductor layer 12 with the insulating layer 20 interposed. Thereby, the surface area of the end surface (the first end surface 31ae) of the first columnar portion 31a on the side opposite to the semiconductor stacked body 10 is set to be greater than the surface area of the first light emitting unit electrode 14.

It is important to maintain good connectability in the case where the semiconductor light emitting device 110 is downsized and the exterior form thereof (in particular, the surface area of the surface parallel to the X-Y plane) is smaller.

For example, there are cases where the connectability degrades in a comparative example in which the surface area of the first light emitting unit electrode 14 connected to the first semiconductor layer 11 of an n-type semiconductor is set to be less than the surface area of the second light emitting unit electrode 15 connected to the second semiconductor layer 12 of a p-type semiconductor and the surface area of the first end surface 31ae of the first conductive member 30a connected to the first light emitting unit electrode 14 is as small as the surface area of the first light emitting unit electrode 14. Therefore, connection defects occur easily. Further, easy degradation of the connectability impedes the downsizing of the semiconductor light emitting device 110.

In the semiconductor light emitting device 110, the first columnar portion 31a covers the one portion 12p of the second semiconductor layer 12 on the second major surface 10a side with the insulating layer 20 interposed. Thereby, the cross-sectional area (the cross-sectional area when cut by the X-Y plane) of the first columnar portion 31a can be greater than the surface area of the first light emitting unit electrode 14. Thereby, even in the case where the surface area of the first light emitting unit electrode 14 is small, the surface area of the first end surface 31ae of the first columnar portion 31a (the first conductive member 30a) connected to the first light emitting unit electrode 14 can be increased. Thereby, in the light source apparatus 310, good connectability can be realized between the first conductive member 30a and the first substrate electrode 210a.

The effects of such a configuration are realized particularly effectively in the case where the semiconductor light emitting device 110 is downsized and the exterior form thereof (in particular, the surface parallel to the X-Y plane) is smaller. These are realized particularly effectively in the case where the surface area of the first light emitting unit electrode 14 is less than the surface area of the second light emitting unit electrode 15. In other words, it is possible to downsize the semiconductor light emitting device 110 by the configuration in which the first columnar portion 31a covers the one portion 12p of the second semiconductor layer 12 on the second major surface 10a side with the insulating layer 20 interposed.

The size of the surface of the semiconductor light emitting device 110 parallel to the X-Y plane can be the minimum size of a bottom surface electrode-type electronic part. For example, the surface of the semiconductor light emitting device 110 parallel to the X-Y plane may be a 600 μm by 300 μm rectangle. For example, the exterior form of the semiconductor light emitting device 110 may be a 600 μm by 300 μm by 300 μm rectangular parallelepiped. Also, the surface of the semiconductor light emitting device 110 parallel to the X-Y plane may be a 1000 μm by 500 μm rectangle. For example, the exterior form of the semiconductor light emitting device 110 may be a 1000 μm by 500 μm by 500 μm rectangular parallelepiped. However, the embodiment is not limited thereto. The size and the configuration of the surface of the semiconductor light emitting device 110 parallel to the X-Y plane and the size and the configuration of the semiconductor light emitting device 110 are arbitrary.

In the case where the length of the side of the semiconductor light emitting device 110 along the X-axis direction is 600 μm and the length of the side along the Y-axis direction is 300 μm, the cross section of the first columnar portion 31a when cut by the X-Y plane and the cross section of the second columnar portion 31b when cut by the X-Y plane may be rectangles of, for example, 200 μm by 150 μm.

Thus, in the semiconductor light emitting device 110, the cross-sectional area (the cross-sectional area when cut by the X-Y plane) of the first columnar portion 31a and the second columnar portion 31b can be relatively large.

Thereby, the heat generated at the light emitting unit 10d can be transmitted efficiently toward the first substrate electrode 210a via the first columnar portion 31a and the first connection member 230a. Also, the heat generated at the light emitting unit 10d can be transmitted efficiently toward the second substrate electrode 210b via the second columnar portion 31b and the second connection member 230b. Then, the heat transmitted to the first substrate electrode 210a and the second substrate electrode 210b is dissipated by the first substrate electrode 210a and the second substrate electrode 210b.

In such a case, in the light source apparatus 310 according to the embodiment, a high heat dissipation effect is obtained by the surface area of the second substrate electrode 210b being set to be not less than 100 times the cross-sectional area of the second columnar portion 31b cut by a plane parallel to the second major surface 10a. Further, the surface area of the first substrate electrode 210a may be set to be not less than 100 times the cross-sectional area of the first columnar portion 31a cut by a plane parallel to the second major surface 10a. For example, in the case where the second light emitting unit electrode 15 (e.g., the p-side electrode) to which the second columnar portion 31b is connected generates heat more easily than the first light emitting unit electrode 14 (e.g., the n-side electrode), the surface area of the first substrate electrode 210a may be less than 100 times the cross-sectional area of the first columnar portion 31a if a high heat dissipation can be obtained by setting the surface area of the second substrate electrode 210b to be not less than 100 times the cross-sectional area of the second columnar portion 31b.

A high heat dissipation effect is obtained by the surface area of the second substrate electrode 210b being set to be not less than 30 times the cross-sectional area of the light emitting unit 10d cut by a plane parallel to the second major surface 10a. The surface area of the first substrate electrode 210a may be set to be not less than 30 times the cross-sectional area of the light emitting unit 10d cut by a plane parallel to the second major surface 10a. For example, in the case where the second light emitting unit electrode 15 (e.g., the p-side electrode) to which the second columnar portion 31b is connected generates heat more easily than the first light emitting unit electrode 14 (e.g., the n-side electrode), the surface area of the first substrate electrode 210a may be less than 30 times the cross-sectional area of the light emitting unit 10d if a high heat dissipation effect can be obtained by setting the surface area of the second substrate electrode 210b to be not less than 30 times the cross-sectional area of the light emitting unit 10d.

For example, the thermal conductivities of the first substrate electrode 210a and the second substrate electrode 210b may be set to be higher than the thermal conductivities of the first connection member 230a and the second connection member 230b. In the light source apparatus 310, the first substrate electrode 210a and the second substrate electrode 210b function as heat-dissipating units.

In the semiconductor light emitting device 110, the heat dissipation path of the heat generated at the light emitting unit 10d is limited because the semiconductor light emitting device 110 has a small size substantially equivalent to the size of the light emitting unit 10d. In the semiconductor light emitting device 110, the temperature easily increases locally around the first connection member 230a and the second connection member 230b. In such a case, a high heat dissipation effect is obtained by increasing the surface areas of the first substrate electrode 210a and the second substrate electrode 210b which have heat dissipation functions and high thermal conductivities.

On the other hand, for example, in a comparative example in which an LED chip is mounted to a leadframe, etc., and the electrodes of the LED chip are connected to the interconnect electrodes of the leadframe by wires, there is substantially no effect of the heat generated at the LED chip being dissipated by the interconnect electrodes via the fine wires. Therefore, the interconnect electrodes to which the wires are connected have only the function of supplying current to the LED and do not have a heat dissipation function.

Conversely, in the semiconductor light emitting device 110 according to the embodiment, the cross-sectional area of the first columnar portion 31a of the first conductive member 30a and the second columnar portion 31b of the second conductive member 30b connected to the light emitting unit 10d is large (e.g., markedly larger than the cross-sectional area of the wires). Therefore, the heat generated at the light emitting unit 10d is transmitted efficiently to the first substrate electrode 210a and the second substrate electrode 210b via the first columnar portion 31a and the second columnar portion 31b, respectively. Thereby, in the light source apparatus 310, the first substrate electrode 210a and the second substrate electrode 210b may have a heat dissipation function in addition to the function of supplying current to the light emitting unit 10d.

Figure 3A:
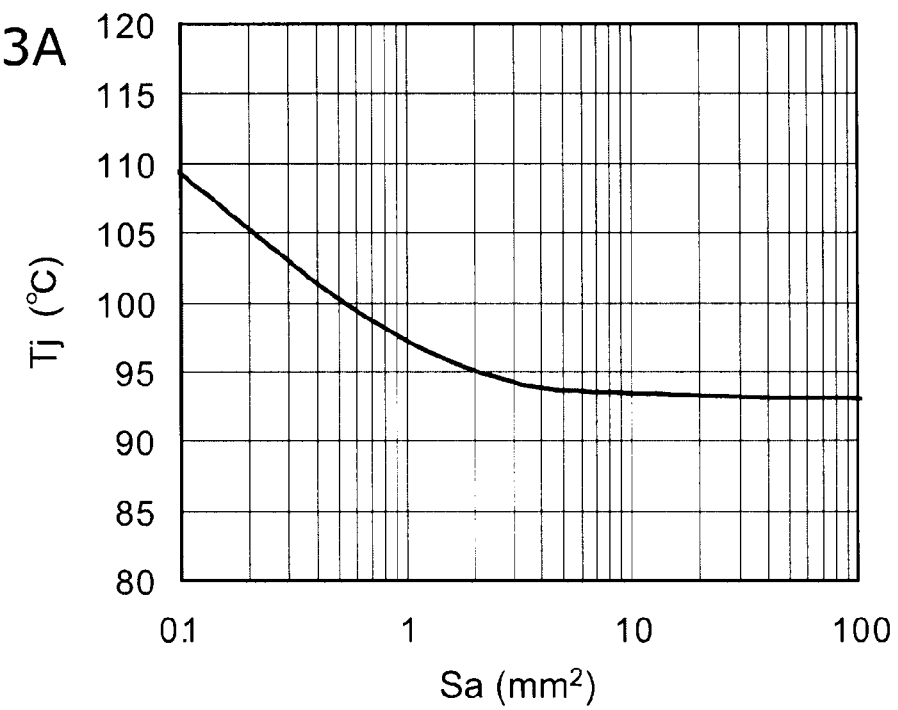
FIG. 3A to FIG. 3C are schematic views illustrating a thermal characteristic of the light source apparatus according to the embodiment.
Figure 3B:
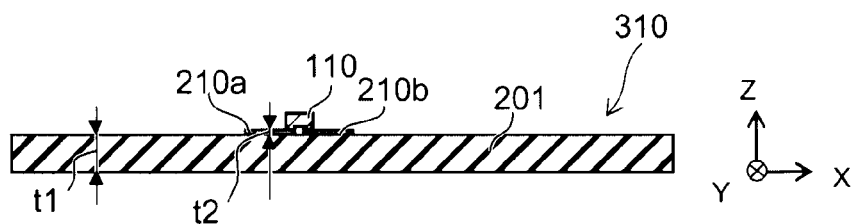
Figure 3C:
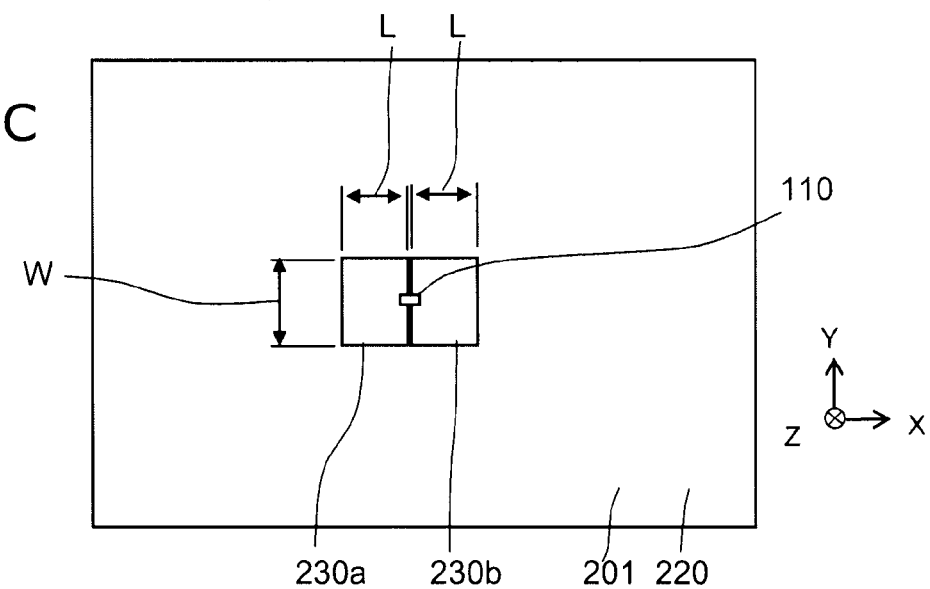

FIG. 3A to FIG. 3C are schematic views illustrating a thermal characteristic of the light source apparatus according to the embodiment.

Namely, FIG. 3A is a graph illustrating simulation results of the thermal characteristic of the light source apparatus 310. FIG. 3C is a schematic plan view illustrating the simulation conditions; and FIG. 3B is a schematic cross-sectional view.

This simulation simulated the temperature (a bonding portion temperature Tj) of the bonding portion between the first substrate electrode 210a and the first connection member 230a and the bonding portion between the second substrate electrode 210b and the second connection member 230b while changing the surface areas (a substrate electrode surface area Sa) of the first substrate electrode 210a and the second substrate electrode 210b.

Specifically, as illustrated in FIG. 3B and FIG. 3C, a length L along the X-axis direction of the first substrate electrode 210a and the second substrate electrode 210b and a length W along the Y-axis direction of the first substrate electrode 210a and the second substrate electrode 210b were changed. Here, the length W was taken to be ⅔ of the length L. The first substrate electrode 210a and the second substrate electrode 210b were taken to be Cu; and a thickness t2 thereof was taken to be 100 μm.

A thickness t1 of the base body 201 of the mounting substrate 250 was taken to be 600 μm; and a Cu film (not illustrated) having a thickness of 60 μm was taken to be provided on the entire back surface of the base body 201 (the surface on the side opposite to the first substrate electrode 210a and the second substrate electrode 210b). The Cu film had the effect of improving the heat dissipation of the base body 201. The semiconductor light emitting device 110 was taken to be 600 μm (the X-axis direction) by 300 μm (the Y-axis direction) by 300 μm (the Z-axis direction). The cross-sectional areas of the first columnar portion 31a and the second columnar portion 31b (the cross-sectional area when cut by a plane parallel to the second major surface 10a) were taken to be 200 μm by 150 μm. The thicknesses of the first columnar portion 31a and the second columnar portion 31b (the length along the Z-axis direction) were taken to be about 60 μm. In this simulation, the temperature around the light source apparatus 310 was taken to be 60° C.

The horizontal axis of the graph of FIG. 3A is the substrate electrode surface area Sa; and the vertical axis is the bonding portion temperature Tj.

As illustrated in FIG. 3A, the bonding portion temperature Tj is high when the substrate electrode surface area Sa is small. The bonding portion temperature Tj decreases as the substrate electrode surface area Sa increases. This is because the heat dissipation effect of the heat generated in the light emitting unit 10d by the first substrate electrode 210a and the second substrate electrode 210b increases as the substrate electrode surface area Sa increases.

The value of the bonding portion temperature Tj becomes substantially constant when the substrate electrode surface area Sa becomes about 3 square millimeters ($mm^2$) to about 4 $mm^2$. In other words, it is desirable for the substrate electrode surface area Sa to be not less than 3 $mm^2$. For the condition where the substrate electrode surface area Sa is smaller than 3 $mm^2$, the heat dissipation effect of the first substrate electrode 210a and the second substrate electrode 210b is in the midst of improving. The heat dissipation effect is in a state of being sufficiently realized when the substrate electrode surface area Sa is not less than 3 mm$^2$.

In this simulation, the cross-sectional areas of the first columnar portion 31a and the second columnar portion 31b (the cross-sectional area cut by a plane parallel to the second major surface 10a) were 200 µm by 150 µm for 0.03 mm$^2$. Therefore, it can be said that a sufficient heat dissipation effect is realized when the surface areas of the first substrate electrode 210a and the second substrate electrode 210b (the substrate electrode surface area Sa) are not less than 100 times the cross-sectional areas of the first columnar portion 31a and the second columnar portion 31b.

As described above, in the case where the second light emitting unit electrode 15 (e.g., the p-side electrode) to which the second columnar portion 31b is connected generates heat more easily than the first light emitting unit electrode 14 (e.g., the n-side electrode), the surface area of the first substrate electrode 210a may be less than 100 times the cross-sectional area of the first columnar portion 31a if a high heat dissipation can be obtained by setting the surface area of the second substrate electrode 210b to be not less than 100 times the cross-sectional area of the second columnar portion 31b.

In this simulation, the cross-sectional area of the semiconductor light emitting device 110 was 600 µm by 300 µm for 0.18 mm$^2$. Therefore, it can be said that a sufficient heat dissipation effect is realized when the surface area of the first substrate electrode 210a and the surface area of the second substrate electrode 210b are not less than 30 times the cross-sectional area of the light emitting unit 10d cut by a plane parallel to the second major surface 10a.

As described above, in the case where the second light emitting unit electrode 15 (e.g., the p-side electrode) to which the second columnar portion 31b is connected generates heat more easily than the first light emitting unit electrode 14 (e.g., the n-side electrode), the surface area of the first substrate electrode 210a may be less than 30 times the cross-sectional area of the light emitting unit 10d if a high heat dissipation effect can be obtained by setting the surface area of the second substrate electrode 210b to be not less than 30 times the cross-sectional area of the light emitting unit 10d.

As illustrated in FIG. 3A, it is more desirable for the surface area of the first substrate electrode 210a and the surface area of the second substrate electrode 210b to be not less than 10 mm$^2$. When the substrate electrode surface area Sa is not less than 10 mm$^2$, the bonding portion temperature Tj is substantially constant and a state is reached in which the heat dissipation effect is realized more sufficiently.

In other words, it is more desirable for the surface area of the second substrate electrode 210b to be not less than 333 times the cross-sectional area of the second columnar portion 31b. Also, it is more desirable for the surface area of the second substrate electrode 210b to be not less than 56 times the cross-sectional area of the light emitting unit 10d cut by a plane parallel to the second major surface 10a.

It is desirable for the longitudinal length and the lateral length of the planar configuration of the first substrate electrode 210a and the second substrate electrode 210b to be relatively near to each other. In other words, in the case where the planar configuration is, for example, a band configuration with a narrow width, the heat dissipation effect may not be sufficiently realized because the thermal resistance in the length direction increases.

The planar configurations (the configuration of the X-Y plane) of the first substrate electrode 210a and the second substrate electrode 210b are arbitrary and may be substantially rectangular (including square), substantially flattened circular (including circular), polygonal, etc.

Although one semiconductor light emitting device is provided for the set of the first substrate electrode 210a and the second substrate electrode 210b in the specific example, multiple semiconductor light emitting devices may be provided for the set of the first substrate electrode 210a and the second substrate electrode 210b.

In such a case, the surface area of the second substrate electrode 210b is set to be not less than 100 times the total of the cross-sectional areas of the second columnar portion 31b (the cross-sectional areas cut by a plane parallel to the second major surface 10a) of the multiple semiconductor light emitting devices. Also, the surface area of the second substrate electrode 210b is set to be not less than 30 times the total of the multiple light emitting unit cross-sectional areas (the cross-sectional areas cut by a plane parallel to the second major surface 10a). Thereby, a high heat dissipation effect is obtained.

Examples of the configuration of the semiconductor light emitting device 110 will now be described further.

Hereinbelow, examples of the configuration will be described for the case where the length of the side of the semiconductor light emitting device 110 along the X-axis direction is 600 µm and the length of the side along the Y-axis direction is 300 µm.

The length of the side of the first semiconductor layer 11 along the X-axis direction may be, for example, 570 µm. The length of the side of the first semiconductor layer 11 along the Y-axis direction may be, for example, 270 µm.

The length of the semiconductor light emitting device 110 along the X-axis direction (the direction from the first columnar portion 31a toward the second columnar portion 31b) may be set to be longer than the length of the semiconductor light emitting device 110 along the Y-axis direction (the direction orthogonal to the direction from the first columnar portion 31a toward the second columnar portion 31b and the direction from the second major surface 10a toward the first major surface 10b).

The length of the first semiconductor layer 11 along the X-axis direction may be set to be longer than the length of the first semiconductor layer 11 along the Y-axis direction.

Thereby, the size of the first end surface 31ae and the size of the second end surface 31be may be set to be large in the case where the first end surface 31ae and the second end surface 31be are disposed along the X-axis direction. Thereby, the connectability of the electrodes can be increased further.

The fluorescer layer 61 may include, for example, a resin into which a fluorescer particle configured to absorb light and emit light of a wavelength longer than the wavelength of such light is mixed. The fluorescer absorbs, for example, at least one light selected from blue light, violet light, and ultraviolet light and emits light of a wavelength longer than that of such light. The resin into which the fluorescer is mixed may include, for example, a silicone resin. The thickness of the fluorescer layer 61 may be, for example, 200 µm. The silicone resin of the fluorescer layer 61 may include methyl phenyl silicone having a refractive index of, for example, about 1.5. However, the embodiment is not limited thereto. The resin and the fluorescer included in the fluorescer layer 61 are arbitrary.

As described above, the second light emitting unit electrode 15 may include a conductive layer and a reflective layer provided between the conductive layer and the second semiconductor layer 12. The reflective layer may contain, for example, at least one selected from Ag and Al. The thickness of the reflective layer may be, for example, 0.3 µm. The reflective layer may be provided, for example, in a region of substantially the entire second semiconductor layer 12 on the second major surface 10a side. Thereby, the emitted light emitted from the light emitting layer 13 can be reflected efficiently toward the first major surface 10b. However, the region where the reflective layer is provided is arbitrary. For example, the reflective layer may be provided in a region of a portion of the second semiconductor layer 12 on the second major surface 10a side.

The second light emitting unit electrode 15 may further include a contact electrode layer provided between the reflective layer and the second semiconductor layer 12 recited above. The contact electrode layer may include, for example, an Au layer (a gold layer) and a Ni layer (a nickel layer) provided between the Au layer and the second semiconductor layer 12. The thickness of the Ni layer may be 0.1 μm; and the thickness of the Au layer may be 0.1 μm.

The first light emitting unit electrode 14 may include, for example, an Au layer and a Ni layer provided between the Au layer and the first semiconductor layer 11. The thickness of the Au layer may be, for example, 0.1 μm; and the thickness of the Ni layer may be 0.1 μm. The first light emitting unit electrode 14 may be provided, for example, in a region of substantially the entire first semiconductor layer 11 on the second major surface 10a side. However, the region where the first light emitting unit electrode 14 is provided is arbitrary; and the first light emitting unit electrode 14 is provided in at least a portion of the first semiconductor layer 11 on the second major surface 10a side.

The first light emitting unit electrode 14 may include a conductive layer and a reflective layer provided between the conductive layer and the first semiconductor layer 11. Thus, the first light emitting unit electrode 14 may have a stacked structure.

The conductive layer of the second light emitting unit electrode 15 may include, for example, an Au layer and a Ni layer provided between the Au layer and the second semiconductor layer 12. The thickness of the Au layer may be, for example, 0.1 μm; and the thickness of the Ni layer may be 0.1 μm. The second light emitting unit electrode 15 may be provided, for example, in a region of substantially the entire second semiconductor layer 12 on the second major surface 10a side. However, the region where the second light emitting unit electrode 15 is provided is arbitrary; and the second light emitting unit electrode 15 is provided in at least a portion of the second semiconductor layer 12 on the second major surface 10a side.

The first connection portion 32a included in the first conductive member 30a may include, for example, a metal such as Cu. The first connection portion 32a may include a first layer and a second layer. The first layer is provided between the second layer and the first light emitting unit electrode 14. In other words, the first layer contacts the first light emitting unit electrode 14. The first layer is, for example, a seed layer; and the second layer is, for example, a plating layer. The surface area of the first layer may be equivalent to the surface area of the first light emitting unit electrode 14 or not more than the surface area of the first light emitting unit electrode 14. The surface area of the second layer may be, for example, 250 μm by 150 μm. The thickness of the first layer may be, for example, about 1 μm. The thickness of the second layer may be, for example, 10 μm.

The second connection portion 32b included in the second conductive member 30b may include, for example, a metal such as Cu. The second connection portion 32b may include a third layer and a fourth layer. The third layer is provided between the fourth layer and the second light emitting unit electrode 15. In other words, the third layer contacts the second light emitting unit electrode 15. The third layer is, for example, a seed layer; and the fourth layer is, for example, a plating layer. The third layer is in the same layer as the first layer; and the same material as the material of the first layer may be used as the third layer. The fourth layer is in the same layer as the second layer; and the same material as the material of the second layer may be used as the fourth layer. The surface area of the third layer may be equivalent to the surface area of the second light emitting unit electrode 15 or less than the surface area of the second light emitting unit electrode 15. The surface area of the fourth layer may be, for example, 250 μm by 350 μm. The thickness of the third layer may be, for example, about 1 μm. The thickness of the fourth layer may be, for example, 10 μm.

However, the surface areas, the configurations, and the thicknesses of the first to fourth layers are arbitrary. The first connection portion 32a and the second connection portion 32b may be single-layer thin films or stacked films as recited above. The first connection portion 32a may further include another layer stacked with the first layer and the second layer. The second connection portion 32b may further include another layer stacked with the third layer and the fourth layer.

The first columnar portion 31a may include, for example, a metal such as Cu. The cross section of the first columnar portion 31a when cut by the X-Y plane may be, for example, 200 μm by 150 μm. The thickness of the first columnar portion 31a (the length along the Z-axis direction) may be about, for example, 60 μm. The first light emitting unit electrode 14 is electrically connected to the first columnar portion 31a by the first connection portion 32a.

The second columnar portion 31b may include, for example, a metal such as Cu. The cross section of the second columnar portion 31b when cut by the X-Y plane may be, for example, 200 μm by 150 μm. The thickness of the second columnar portion 31b (the length along the Z-axis direction) may be about, for example, 60 μm. The second light emitting unit electrode 15 is electrically connected to the second columnar portion 31b by the second connection portion 32b.

The materials, the configurations of the cross sections, the cross-sectional areas, and the thicknesses of the first columnar portion 31a and the second columnar portion 31b are not limited to those recited above and are arbitrary.

The sealing member 50 may include, for example, a thermosetting resin. The thickness of the sealing member 50 is about the same as the thicknesses of the first columnar portion 31a and the second columnar portion 31b and is about, for example, 60 μm. The sealing member 50 covers the side surface of the first conductive member 30a (the side surface of the first columnar portion 31a and the side surface of the first connection portion 32a) and the side surface of the second conductive member 30b (the side surface of the second columnar portion 31b and the side surface of the second connection portion 32b) while leaving the first end surface 31ae of the first conductive member 30a and the second end surface 31be of the second conductive member 30b exposed. The sealing member 50 also may cover the surfaces of the first connection portion 32a and the second connection portion 32b on the side opposite to the semiconductor stacked body 10. Further, the sealing member 50 may cover the entire semiconductor stacked body 10 on the second major surface 10a side.

An example of a method for manufacturing the semiconductor light emitting device 110 will now be described.

FIG. 4A to FIG. 4E, FIG. 5A to FIG. 5E, and FIG. 6A to FIG. 6E are schematic cross-sectional views in order of the processes, illustrating the method for manufacturing the semiconductor light emitting device used in the light source apparatus according to the embodiment.

Namely, these drawings are cross-sectional views corresponding to the cross section along line A-A' of FIG. 2B. However, these illustrations are vertically inverted.

This manufacturing method is a method of collectively manufacturing the multiple semiconductor light emitting devices 110 at the wafer level.

Figure 4A:
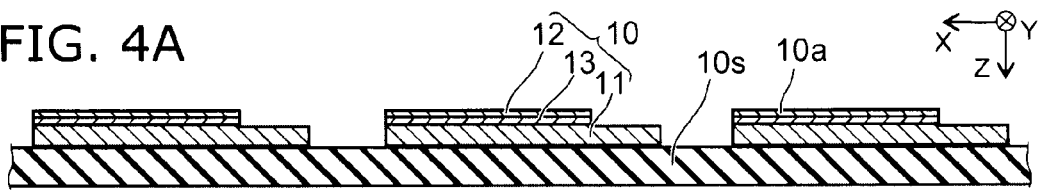
FIG. 4A to FIG. 4E are schematic cross-sectional views in order of the processes, illustrating a method for manufacturing the semiconductor light emitting device used in the light source apparatus according to the embodiment.

As illustrated in FIG. 4A, a substrate 10s is used on which the semiconductor stacked body 10 is formed. The substrate 10s includes, for example, a sapphire substrate. The size of the substrate 10s is, for example, 4 inches in diameter; and the thickness of the substrate 10s is, for example, about 500 μm. The method of forming the semiconductor stacked body 10 is, for example, as follows. Namely, a crystal film used to form the first semiconductor layer 11, a crystal film used to form the light emitting layer 13, and a crystal film used to form the second semiconductor layer 12, which are nitride semiconductors, are epitaxially grown on the substrate 10s; these crystal films are etched using, for example, RIE (Reactive Ion Etching); and a portion of the first semiconductor layer 11 on the second major surface 10a side is exposed. These crystal films are patterned using, for example, RIE and singulated to form the multiple semiconductor stacked bodies 10.

Figure 4B:
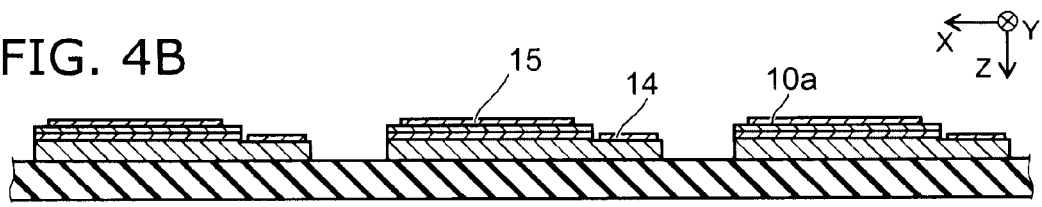

Then, as illustrated in FIG. 4B, the first light emitting unit electrode 14 and the second light emitting unit electrode 15 are formed by forming a film used to form the first light emitting unit electrode 14 and the second light emitting unit electrode 15 on the second major surface 10a of the semiconductor stacked body 10 and by patterning this film into a prescribed configuration. Then, the protective layer 18 is formed. The protective layer 18 is not illustrated in FIG. 2B to avoid complexity.

Specifically, for example, a film used to form a contact electrode layer is formed on the second major surface 10a of the semiconductor stacked body 10. Namely, a Ni film is formed with a thickness of 0.1 μm; and an Au film is formed with a thickness of 0.1 μm thereon. Thereby, the film used to form the contact electrode layer is formed. The formation of the Ni film and the Au film may include, for example, sputtering. Further, a layer used to form a reflective layer is formed on the Au film. Namely, a film including at least one selected from Ag and Al is formed as the reflective layer with a thickness of, for example, 0.3 μm. In such a case as well, sputtering may be used. Thereby, the film used to form the reflective layer is formed.

A conductive film used to form the conductive layers of the first light emitting unit electrode 14 and the second light emitting unit electrode 15 is formed on the film used to form the reflective layer. Namely, a Ni film of, for example, 0.1 μm is formed on the film used to form the reflective layer; and an Au film is formed thereon with a thickness of 0.1 μm. This formation of the Ni film and the Au film also may include, for example, sputtering.

The film used to form the contact electrode layer, the film used to form the reflective layer, and the conductive film used to form the conductive layers of the first light emitting unit electrode 14 and the second light emitting unit electrode 15 are patterned into a prescribed configuration. Thereby, the first light emitting unit electrode 14 and the second light emitting unit electrode 15 are formed. The patterning of each of the films recited above may include any method such as, for example, lift-off. The contact electrode layer, the reflective layer, and the conductive layer of the first light emitting unit electrode 14 may have mutually different pattern configurations. The contact electrode layer, the reflective layer, and the conductive layer of the second light emitting unit electrode 15 may have mutually different pattern configurations.

Then, a $SiO_2$ film used to form the protective layer 18 is formed with a thickness of, for example, 0.3 μm using, for example, CVD in a region excluding at least a portion of the first light emitting unit electrode 14 and a region excluding at least a portion of the second light emitting unit electrode 15; and the protective layer 18 is formed by patterning using, for example, dry etching or wet etching.

Figure 4C:
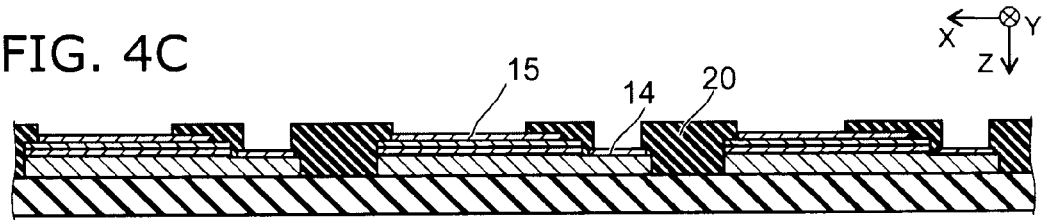

Continuing as illustrated in FIG. 4C, the insulating layer 20 is formed to cover the one portion 12p of the second semiconductor layer 12 on the second major surface 10a side. The insulating layer 20 is formed in a region excluding at least a portion of the first light emitting unit electrode 14 and a region excluding at least a portion of the second light emitting unit electrode 15. In the specific example, the insulating layer 20 also is provided between the multiple semiconductor stacked bodies 10.

The insulating layer 20 may include, for example, polyimide or PBO (polybenzoxazole). In other words, the insulating layer 20 is formed selectively by forming a polyimide film, for example, used to form the insulating layer 20 on the entire surface of the second major surface 10a of the semiconductor stacked body 10 and by performing exposing and developing using, for example, a mask. The patterned insulating layer 20 is baked if necessary.

Subsequently, a conductive film used to form at least a portion of the first conductive member 30a is formed on the insulating layer 20 covering the one portion 12p of the second semiconductor layer 12 on the second major surface 10a side. This conductive film also may be used to form at least a portion of the second conductive member 30b. This conductive film also may be formed to cover at least a portion of the first light emitting unit electrode 14 not covered with the insulating layer 20 and at least a portion of the second light emitting unit electrode 15 not covered with the insulating layer 20. Specifically, the following processing is performed.

Figure 4D:
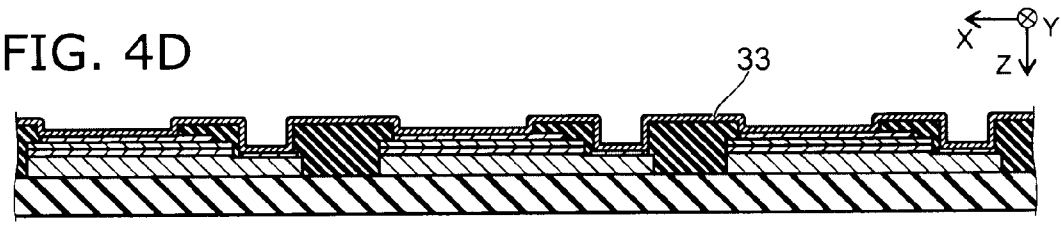

Namely, as illustrated in FIG. 4D, a seed layer 33 used to form the first layer of the first connection portion 32a and the third layer of the second connection portion 32b is formed, for example, on the entire surface of the substrate 10s on the second major surface 10a side. The seed layer 33 is formed using, for example, a physical covering method such as vapor deposition, sputtering, etc. The seed layer 33 functions as the power supply layer of the plating process described below. The seed layer 33 may include, for example, a stacked film of a Ti film and a Cu film. The adhesion strength between the Cu film and the resists and between the Cu film and the pads (the first light emitting unit electrode 14 and the second light emitting unit electrode 15) can be increased by the Ti layer of the seed layer 33. The thickness of the Ti layer may be, for example, about 0.2 μm. On the other hand, the Cu film of the seed layer 33 contributes mainly to the power supply. It is desirable for the thickness of the Cu film to be not less than 0.2 μm.

Figure 4E:
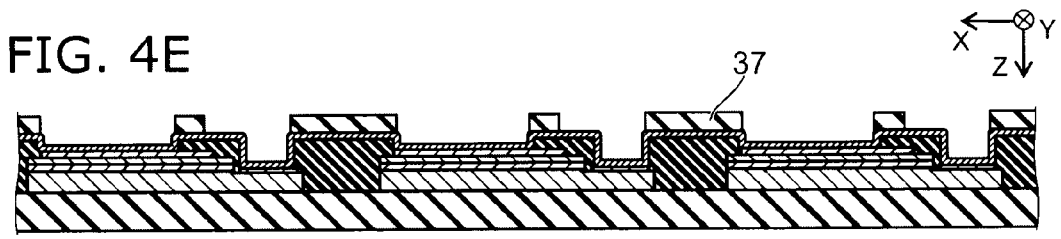

Then, as illustrated in FIG. 4E, a first resist layer 37 is formed in a region other than the region corresponding to the first connection portion 32a and the region corresponding to the second connection portion 32b. The first resist layer 37 may include, for example, a photosensitive liquid resist or dry film resist. The first resist layer 37 is formed by first forming a film used to form the first resist layer 37 and subsequently exposing using a light-shielding mask having prescribed openings and developing. The first resist layer 37 may be baked if necessary.

Figure 5A:
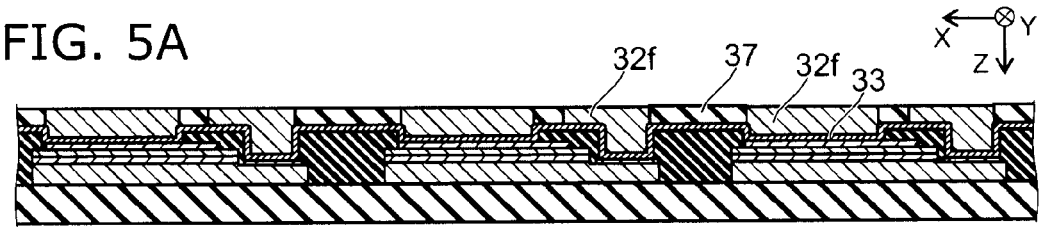
FIG. 5A to FIG. 5E are schematic cross-sectional views in order of the processes, illustrating a method for manufacturing the semiconductor light emitting device used in the light source apparatus according to the embodiment.

Continuing as illustrated in FIG. 5A, a connection portion conductive film 32f used to form the second layer of the first connection portion 32a and the fourth layer of the second connection portion 32b is formed in a region where the first resist layer 37 is not provided. The connection portion conductive film 32f is formed using, for example, electroplating. In the electroplating, for example, the substrate 10s on which the patterning body recited above is provided is immersed in a plating liquid made of copper sulfate and sulfuric acid; the seed layer 33 is connected to the negative terminal of a direct-current power source; and a Cu plate used as an anode is disposed opposing the surface to be plated of the substrate 10s and connected to the positive terminal of the direct-current power source. The plating of the Cu is performed by providing a current between the negative terminal and the positive terminal. The thickness of the plating film of the plating process increases as time elapses; and the plating is completed by stopping the flow of the current when the thickness of the plating film reaches the necessary thickness. Thereby, the connection portion conductive film 32f made of the plating film is formed in the openings of the first resist layer 37.

The seed layer 33 (the first layer) at the position corresponding to the first light emitting unit electrode 14 and the connection portion conductive film 32f (the second layer) at the position corresponding to the first light emitting unit electrode 14 are used to form the first connection portion 32a. The seed layer 33 (the third layer) at the position corresponding to the second light emitting unit electrode 15 and the connection portion conductive film 32f (the fourth layer) at the position corresponding to the second light emitting unit electrode 15 are used to form the second connection portion 32b.

The first connection portion 32a corresponds to the conductive film used to form at least a portion of the first conductive member 30a formed on the insulating layer 20 covering the one portion 12p of the second semiconductor layer 12 on the second major surface 10a side. In the specific example, the seed layer 33 and the connection portion conductive film 32f used to form the conductive film also are the conductive film used to form at least a portion of the second conductive member 30b. Further, the seed layer 33 and the connection portion conductive film 32f used to form the conductive film are formed to cover at least a portion of the first electrode 14 not covered with the insulating layer 20 and at least a portion of the second electrode 15 not covered with the insulating layer 20.

Subsequently, the first columnar portion 31a is formed on the first connection portion 32a (the conductive film used to form at least a portion of the first conductive member 30a formed on the insulating layer 20 covering the one portion 12p of the second semiconductor layer 12 on the second major surface 10a side). Specifically, for example, the following processing is performed.

Figure 5B:
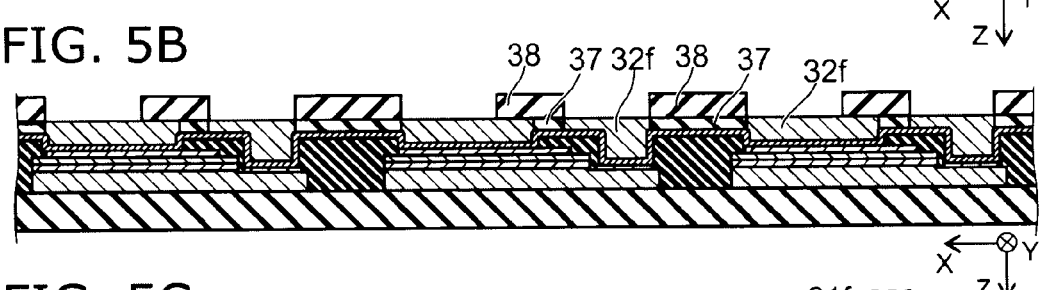

As illustrated in FIG. 5B, a second resist layer 38 is formed in a region other than the region corresponding to the first columnar portion 31a and the region corresponding to the second columnar portion 31b. The materials and the methods described in regard to the first resist layer 37 may be employed for the material of the second resist layer 38 and the formation of the second resist layer 38.

Figure 5C:
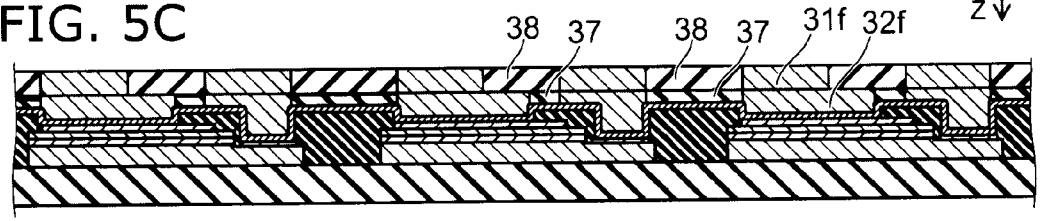

Then, as illustrated in FIG. 5C, a columnar portion conductive film 31f used to form the first columnar portion 31a and the second columnar portion 31b is formed in a region where the second resist layer 38 is not provided. The columnar portion conductive film 31f also is formed using, for example, electroplating. The materials and the methods described in regard to the formation of the connection portion conductive film 32f may be applied to the formation of the columnar portion conductive film 31f. The portion of the columnar portion conductive film 31f connected to the first connection portion 32a is used to form the first columnar portion 31a; and the portion of the columnar portion conductive film 31f connected to the second connection portion 32b is used to form the second columnar portion 31b.

Figure 5D:
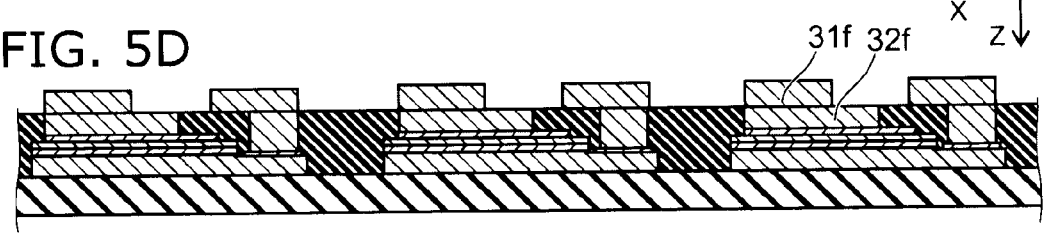

Continuing as illustrated in FIG. 5D, the first resist layer 37 and the second resist layer 38 are removed. The exposed seed layer 33 is removed using, for example, acid cleaning. The seed layer 33 covered with the connection portion conductive film 32f remains as the first layer and the third layer which are included in the first connection portion 32a and the second connection portion 32b, respectively.

Figure 5E:
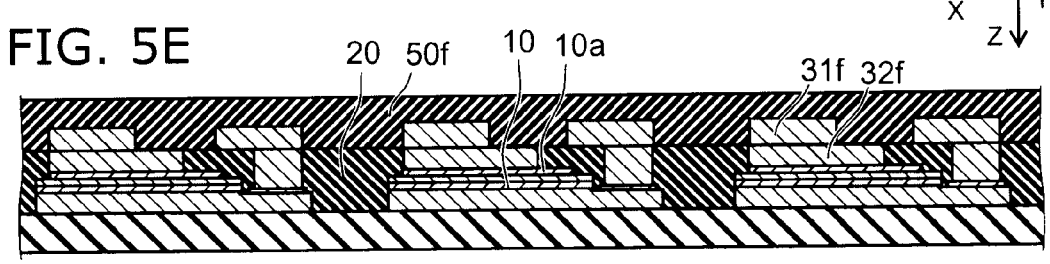

Then, as illustrated in FIG. 5E, a resin layer 50f used to form the sealing member 50 is formed on the surface of the substrate 10s on the second major surface 10a side. The resin layer 50f may include, for example, a thermosetting resin. The resin layer 50f is formed by, for example, forming a film used to form the resin layer 50f by a method such as printing on the surface of the substrate 10s on the second major surface 10a side with a thickness enough to bury the first columnar portion 31a and the second columnar portion 31b and by heating to cure. The heating conditions when curing the resin layer 50f are, for example, about 150° C. for about 2 hours.

Then, as illustrated in FIG. 6A, the first columnar portion 31a and the second columnar portion 31b are exposed by polishing the front surface of the resin layer 50f. Thereby, the sealing member 50 is formed. A portion of the first columnar portion 31a and a portion of the second columnar portion 31b may be polished when polishing the resin layer 50f. Thereby, the first end surface 31ae of the first columnar portion 31a and the second end surface 31be of the second columnar portion 31b are disposed in the surface including the surface of the sealing member 50 on the side opposite to the second major surface 10a.

A rotating polishing wheel, for example, may be used in the polishing recited above. By the rotational polishing, the polishing can be implemented while ensuring the planarity. After the polishing, drying is performed if necessary.

Then, as illustrated in FIG. 6B, the substrate 10s is removed from the semiconductor stacked body 10. Namely, the substrate 10s is separated from the semiconductor stacked body 10 by, for example, irradiating laser light from the surface of the substrate 10s on the side opposite to the semiconductor stacked body 10 through the substrate 10s onto a layer (e.g., a GaN layer) included in the semiconductor stacked body 10 to decompose at least a portion of this layer. The laser light may include, for example, laser light having a wavelength shorter than a bandgap wavelength based on the bandgap of GaN. For example, a Nd:YAG third harmonic laser may be used. However, the laser light used is arbitrary.

Continuing as illustrated in FIG. 6C, in the specific example, the transparent member 62 used to form a portion of the optical layer 60 is formed on the first major surface 10b of the semiconductor stacked body 10. Namely, the transparent member 62 is formed, for example, by coating a liquid transparent resin layer onto the first major surface 10b of the semiconductor stacked body 10 using printing, etc., deforming the transparent resin layer into a prescribed configuration by pressing a template having the prescribed configuration onto the transparent resin layer, subsequently releasing the template, and curing if necessary by performing at least one processing selected from heating and ultraviolet irradiation. By employing such methods, the transparent member 62 can be formed easily in any configuration by using a template having the desired configuration.

Then, as illustrated in FIG. 6D, a fluorescer film 61f used to form the fluorescer layer 61 is formed to cover the transparent member 62. The fluorescer film 61f is formed by, for example, using spin coating or printing to coat a resin material, in which a fluorescer particle and a silicone resin are mixed, to cover the transparent member 62 and by subsequently thermally curing the resin material. The resin material may include, for example, a material that cures by heating at 150° C. for 1 hour.

Continuing as illustrated in FIG. 6E, the resin layer 50f used to form the sealing member 50 and the fluorescer film 61f used to form the fluorescer layer 61 are separated into the multiple semiconductor stacked bodies 10 by cutting. Thereby, the multiple semiconductor light emitting devices 110 can be collectively manufactured. The cutting recited above may include, for example, dicing using a dicer.

In the manufacturing method recited above, the electrodes, the sealing member, and the optical layer can be formed collectively at the wafer level; and the productivity is high. Inspections also are possible at the wafer level. Thereby, the semiconductor light emitting device can be manufactured with high productivity. Downsizing is easy because members such as leadframes, conductive substrates, bonding wires, etc., are unnecessary. Reduced costs also are possible.

In the process of separating the substrate 10s from the semiconductor stacked body 10 described in regard to FIG. 6B, there are cases where the film used to form the insulating layer 20 reaches a high temperature. In other words, the film used to form the insulating layer 20 may be heated when irradiating the laser light from the surface of the substrate 10s on the side opposite to the semiconductor stacked body 10 through the substrate 10s onto the semiconductor stacked body 10. It is desirable for the film used to form the insulating layer 20 to include a material having high heat resistance to suppress the degradation of the film used to form the insulating layer 20 due to the heating at this time.

For example, it is more desirable for the insulating layer 20 to include a resin having a heat resistance higher than that of the resin of the sealing member 50. In other words, it is more desirable for the thermal decomposition temperature of the insulating layer 20 to be higher than the thermal decomposition temperature of the sealing member 50. For example, the insulating layer 20 may include a polyimide having a thermal decomposition temperature not less than about 380° C.; and the sealing member 50 may include an epoxy resin having, for example, a thermal decomposition temperature not less than about 280° C. and not more than about 300° C. The temperature at which, for example, the weight is reduced by a constant proportion (e.g., 5 percent) by heating can be employed as the thermal decomposition temperature.

The occurrence of defects caused by the filler due to the high temperature of the film used to form the insulating layer 20 may occur in the case where the film used to form the insulating layer 20 includes a filler. To suppress the occurrence of such defects, it is desirable for the content ratio of the filler included in the insulating layer 20 to be set to be lower than the content ratio of the filler included in the sealing member 50. For example, the insulating layer 20 may include a polyimide substantially not including a filler.

An example of a method for manufacturing the mounting substrate 250 will now be described.

FIG. 7A to FIG. 7C are schematic cross-sectional views in order of the processes, illustrating the method for manufacturing the mounting substrate used in the light source apparatus according to the embodiment.

Namely, these drawings are cross-sectional views corresponding to the cross section along line A-A' of FIG. 1B.

As illustrated in FIG. 7A, a substrate electrode conductive film 210f used to form the first substrate electrode 210a and the second substrate electrode 210b is formed on the front surface of the base body 201. The substrate electrode conductive film 210f may include, for example, a copper foil. In other words, a copper foil, for example, is adhered on the front surface of the base body 201.

Then, as illustrated in FIG. 7B, the first substrate electrode 210a and the second substrate electrode 210b are formed by patterning the substrate electrode conductive film 210f. Namely, for example, a photoresist film is formed on the substrate electrode conductive film 210f; the photoresist film is developed and patterned; and the substrate electrode conductive film 210f is etched using the patterned photoresist film as a mask. Then, the photoresist film is removed by, for example, ashing, etc.

Continuing as illustrated in FIG. 7C, an insulating material used to form the mounting substrate insulating layer 220 is coated onto the base body 201, the first substrate electrode 210a, and the second substrate electrode 210b using, for example, spin coating, etc., and patterned into a prescribed configuration. Thereby, the mounting substrate insulating layer 220 is formed to leave a portion of the second substrate electrode 210b exposed to connect to the second connection member 230b while leaving a portion of the first substrate electrode 210a exposed to connect to the first connection member 230a.

Thereby, the mounting substrate 250 is constructed.

An example of a method for manufacturing the light source apparatus 310 will now be described.

FIG. 8A and FIG. 8B are schematic cross-sectional views in order of the processes, illustrating the method for manufacturing the light source apparatus according to the embodiment.

Namely, these drawings are cross-sectional views corresponding to the cross section along line A-A' of FIG. 1B.

As illustrated in FIG. 8A, the first connection member 230a and the second connection member 230b are formed on the first substrate electrode 210a and the second substrate electrode 210b, respectively.

Namely, a solder material used to form the first connection member 230a and the second connection member 230b is disposed on the first substrate electrode 210a and the second substrate electrode 210b by, for example, screen printing using a metal mask.

Then, as illustrated in FIG. 8B, the semiconductor light emitting device 110 is placed on the mounting substrate 250 using a mounter. At this time, the first conductive member 30a and the first connection member 230a are caused to oppose each other; and the second conductive member 30b and the second connection member 230b are caused to oppose each other. The first connection member 230a and the second connection member 230b are melted and hardened in this state. Thereby, the first conductive member 30a and the first substrate electrode 210a are bonded by the first connection member 230a; and the second conductive member 30b and the second substrate electrode 210b are bonded by the second connection member 230b.

Thereby, the light source apparatus 310 is manufactured.

FIG. 9A to FIG. 9C and FIG. 10A to FIG. 10C are schematic cross-sectional views illustrating the configuration of other semiconductor light emitting devices used in the light source apparatus according to the embodiment.

Namely, these drawings are cross-sectional views corresponding to the cross section along line A-A' of FIG. 2B.

Figure 9A:
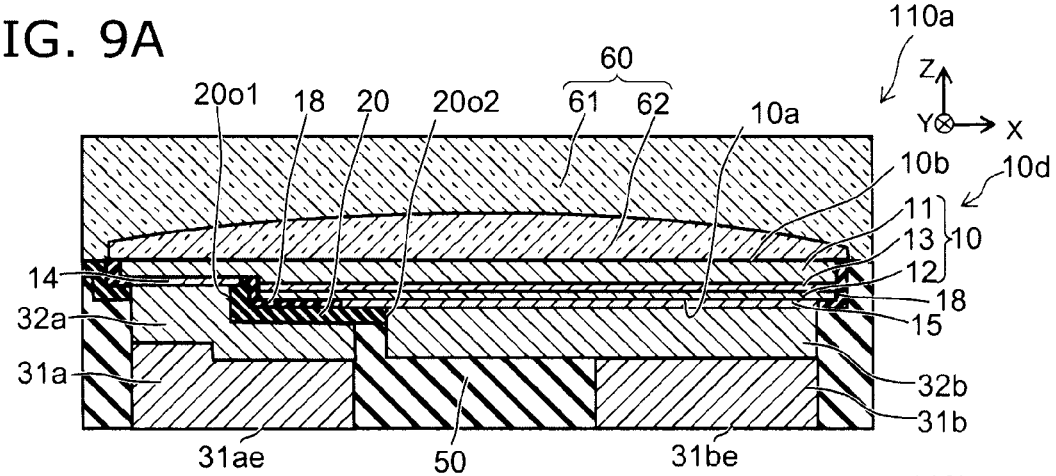
FIG. 9A to FIG. 9C are schematic cross-sectional views illustrating the configuration of other semiconductor light emitting devices used in the light source apparatus according to the embodiment.

In a semiconductor light emitting device 110a according to the embodiment as illustrated in FIG. 9A, the transparent member 62 has a convex lens configuration.

The thickness of the transparent member 62 may be constant. In other words, other than having a lens effect, the transparent member 62 also may have an effect of suppressing the temperature increase of the semiconductor stacked body 10. In other words, although a portion of the energy is absorbed to generate heat during the wavelength conversion of the fluorescer layer 61, the fluorescer layer 61 can be distal to the semiconductor stacked body 10 and the increase of the temperature of the semiconductor stacked body 10 can be suppressed by providing the transparent member 62 between the fluorescer layer 61 and the semiconductor stacked body 10.

Thus, the configuration of the transparent member 62 is arbitrary.

Figure 9B:
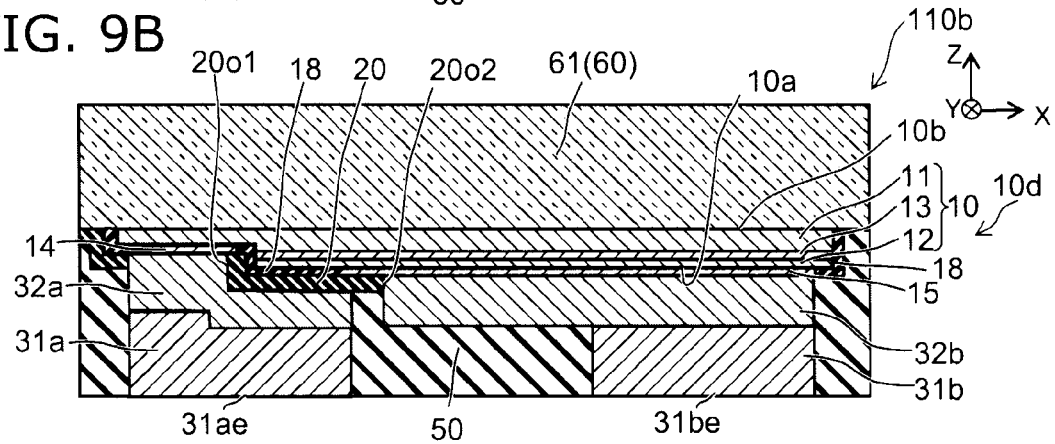

In a semiconductor light emitting device 110b as illustrated in FIG. 9B, the fluorescer layer 61 is provided in the optical layer 60, but the transparent member 62 is not provided. Thus, the transparent member 62 may be provided if necessary.

Figure 9C:
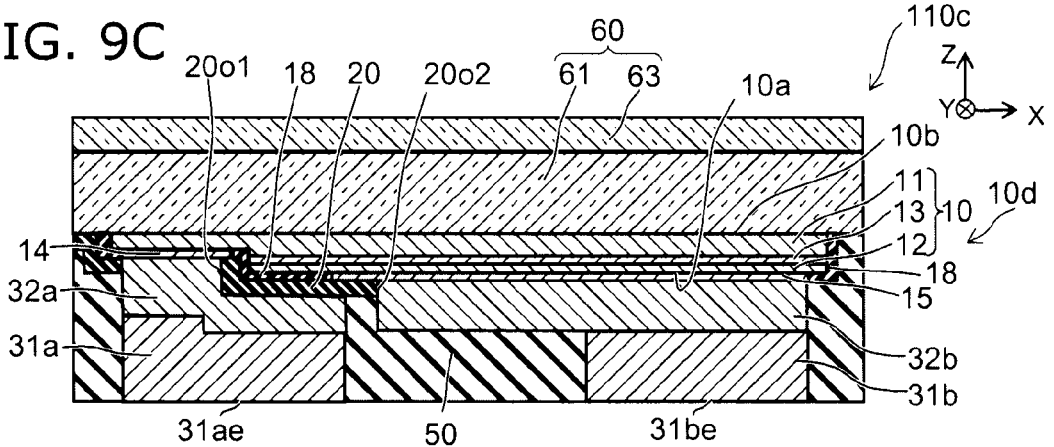

In a semiconductor light emitting device 110c according to the embodiment as illustrated in FIG. 9C, the optical layer 60 includes the fluorescer layer 61 including the fluorescer and a hard film 63 provided on a side of the fluorescer layer 61 opposite to the semiconductor stacked body 10. The hard film 63 has a hardness higher than the hardness of the fluorescer layer 61. The hard film 63 is transparent. The hard film 63 may include, for example, a silicone resin having a high hardness. Spin coating or printing, for example, may be employed to form the hard film 63. The hard film 63 may include, for example, silicon nitride, silicon oxide, etc. In such a case, the hard film 63 may be formed by a method such as, for example, sputtering. However, the material and the formation method of the hard film 63 are arbitrary.

By providing the hard film 63, for example, the handling of the semiconductor light emitting device 110c is easier because the light emitting surface (the surface on the optical layer 60 side) of the semiconductor light emitting device 110c can have a high hardness.

For example, in the case where the hardness of the silicone resin of the fluorescer layer 61 is low, there are cases where, for example, it is difficult to perform the appropriate mounting by closely adhering the fluorescer layer 61 to a collet when picking up the semiconductor light emitting device with the collet if the fluorescer layer 61 is exposed at the outermost surface (the surface most distal to the semiconductor stacked body 10) of the optical layer 60. In such a case, good mounting is easier to implement by providing the hard film 63, which has a higher hardness than the fluorescer layer 61, on the fluorescer layer 61.

In other semiconductor light emitting devices 110d, 110e, and 110f according to the embodiment as illustrated in FIG. 10A, FIG. 10B, and FIG. 10C, the first connection portion 32a and the second connection portion 32b are not provided. In such a case as well, the insulating layer 20 is provided between the first columnar portion 31a and the second semiconductor layer 12; and a portion of the first columnar portion 31a opposes a portion of the second semiconductor layer 12 with the insulating layer 20 interposed. Thereby, the surface area of the first end surface 31ae of the first conductive member 30a can be greater than the surface area of the first electrode 14. According to semiconductor light emitting devices 110d, 110e, and 110f as well, high electrode connectability can be maintained; and a semiconductor light emitting device suited to downsizing can be provided.

Although the transparent member 62 has a convex lens configuration in the semiconductor light emitting device 110d illustrated in FIG. 10A, the configuration of the transparent member 62 may be a concave lens configuration as in the semiconductor light emitting device 110. Or, the thickness of the transparent member 62 may be constant.

The semiconductor light emitting device 110e illustrated in FIG. 10B is an example in which the transparent member 62 is omitted; and the semiconductor light emitting device 110f illustrated in FIG. 10C is an example in which the hard film 63 described in regard to FIG. 9C is provided.

Figure 11:
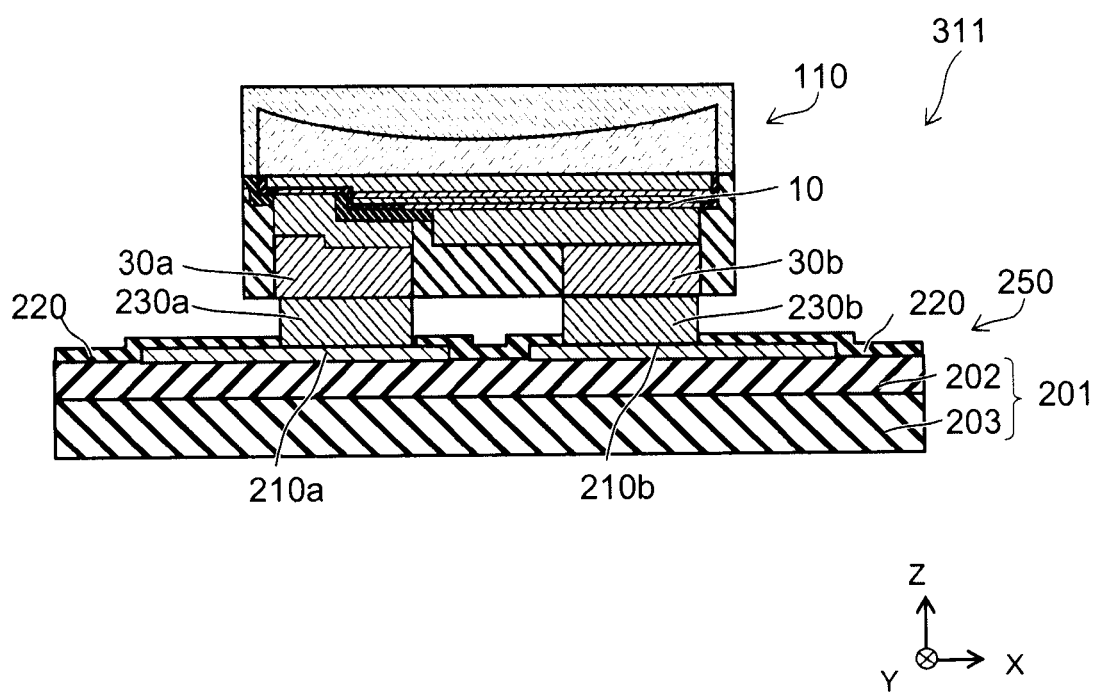
FIG. 11 is a schematic cross-sectional view illustrating the configuration of another light source apparatus according to the embodiment.

FIG. 11 is a schematic cross-sectional view illustrating the configuration of another light source apparatus according to the embodiment.

Namely, this drawing is a cross-sectional view corresponding to the cross section along line A-A' of FIG. 1B.

In the light source apparatus 311 according to the embodiment as illustrated in FIG. 11, the base body 201 of the mounting substrate 250 includes an insulating substrate portion 202 and a metal substrate portion 203.

The first substrate electrode 210a and the second substrate electrode 210b are provided on the insulating substrate portion 202.

The metal substrate portion 203 is stacked with the insulating substrate portion 202 on the side of the insulating substrate portion 202 opposite to the first substrate electrode 210a and the second substrate electrode 210b.

The spread of the heat in the base body 201 is promoted and the heat dissipation improves further by providing the electrically conductive metal substrate portion 203 on the back surface of the insulating substrate portion 202 of the base body 201.

Red fluorescers may include, for example, the following. However, the red fluorescer of the embodiments is not limited to the following:

$Y_2O_2S:Eu$
$Y_2O_2S:Eu+pigment$
$Y_2O_3:Eu$
$Zn_3(PO_4)_2:Mn$
$(Zn, Cd)S:Ag+In_2O_3$
$(Y, Gd, Eu)BO_3$
$(Y, Gd, Eu)_2O_3$
$YVO_4:Eu$
$La_2O_2S:Eu, Sm$
$LaSi_3N_5:Eu^{2+}$
$\alpha$-sialon:$Eu^{2+}$
$CaAlSiN_3:Eu^{2+}$
$CaSiN_x:Eu^{2+}$
$CaSiN_x:Ce^{2+}$
$M_2Si_5N_8Eu^{2+}$
$CaAlSiN_3:Eu^{2+}$
$(SrCa)AlSiN_3:Eu^{x+}$
$Sr_x(Si_yAl_3)_z(O_xN):Eu^{x+}$ Green fluorescers may include, for example, the following. However, the green fluorescer of the embodiments is not limited to the following:

ZnS:Cu, Al
ZnS:Cu, Al+pigment
(Zn, Cd)S:Cu, Al
ZnS:Cu, Au, Al,+pigment
$Y_3Al_5O_{12}:Tb$
$Y_3(Al, Ga)_5O_{12}:Tb$
$Y_2SiO_5:Tb$
$Zn_2SiO_4:Mn$
(Zn, Cd)S:Cu
ZnS:Cu
$Zn_2SiO_4:Mn$
$ZnS:Cu+Zn_2SiO_4:Mn$
$Gd_2O_2S:Tb$
(Zn, Cd)S:Ag
ZnS:Cu, Al $Y_2O_2S$:Tb
ZnS:Cu, Al+$In_2O_3$
(Zn, Cd)S:Ag+$In_2O_3$
(Zn, Mn)$_2SiO_4$
$BaAl_{12}O_{19}$:Mn
(Ba, Sr, Mg)O.a$Al_2O_3$:Mn
$LaPO_4$:Ce, Tb
$Zn_2SiO_4$:Mn
ZnS:Cu
3(Ba, Mg, Eu, Mn)O.8$Al_2O_3$
$La_2O_3$.0.2$SiO_2$.0.9$P_2O_5$:Ce, Tb
$CeMgAl_{11}O_{19}$:Tb
$CaSc_2O_4$:Ce
(BrSr)$SiO_4$:Eu
α-sialon:$Yb^{2+}$
β-sialon:$Eu^{2+}$
(SrBa)$YSi_4N_7$:$Eu^{2+}$
(CaSr)$Si_2O_4N_7$:$EU^{2+}$
Sr(SiAl)(ON):Ce Blue fluorescers may include, for example, the following. However, the blue fluorescer of the embodiments is not limited to the following:

ZnS:Ag
ZnS:Ag+pigment
ZnS:Ag, Al
ZnS:Ag, Cu, Ga, Cl
ZnS:Ag+$In_2O_3$
ZnS:Zn+$In_2O_3$
(Ba, Eu)$MgAl_{10}O_{17}$
(Sr, Ca, Ba, Mg)$_{10}(PO_4)6Cl_2$:Eu
$Sr_{10}(PO_4)6Cl_2$:Eu
(Ba, Sr, Eu)(Mg, Mn)$Al_{10}O_{17}$
10(Sr, Ca, Ba, Eu).$6PO_4.Cl_2$
$BaMg_2Al_{16}O_{25}$:Eu Yellow fluorescers may include, for example, the following. However, the yellow fluorescer of the embodiments is not limited to the following:

Li(Eu, Sm)$W_2O_8$
$(Y, Gd)_3, (Al, Ga)_5O_{12}$:$Ce^{3+}$
$Li_2SrSiO_4$:$Eu^{2+}$
$(Sr(Ca, Ba))_3SiO_5$:$Eu^{2+}$
$SrSi_2ON_{2.7}$:$EU^{2+}$

In the specification, "nitride semiconductor" includes all compositions of semiconductors of the chemical formula $B_xIn_yAl_zGa_{1-x-y-z}N$ ($0 \leq x \leq 1$, $0 \leq y \leq 1$, $0 \leq z \leq 1$, and $x+y+z \leq 1$) for which the compositional proportions x, y, and z are changed within the ranges respectively. "Nitride semiconductor" further includes group V elements other than N (nitrogen) in the chemical formula recited above and any of various dopants added to control the conductivity type, etc.

According to the embodiments as described above, a light source apparatus that has good heat dissipation and uses a small semiconductor light emitting device can be provided.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in light emitting units such as semiconductor layers, light emitting layers, substrate electrodes, conductive layers, reflective layers, and contact electrode layers, components included in semiconductor light emitting devices such as conductive members, columnar portions, connection portions, insulating layers, sealing members, sealing layers, optical layers, wavelength conversion units, fluorescer layers, fluorescers, transparent members, and hard films, components included in mounting substrates such as base bodies and substrate electrodes, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all light source apparatuses practicable by an appropriate design modification by one skilled in the art based on the light source apparatuses described above as embodiments of the invention also are within the scope of the invention to the extent that the purport of the embodiments of the invention is included.

Furthermore, various modifications and alterations within the spirit of the invention will be readily apparent to those skilled in the art. All such modifications and alterations should therefore be seen as within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A light source apparatus, comprising:
   a semiconductor light emitting device including a light emitting unit, a first conductive member, a second conductive member, a sealing member, and an optical layer;
   a mounting substrate including a base body, a first substrate electrode, and a second substrate electrode, the first substrate electrode and the second substrate electrode being provided on a surface of the base body to oppose the semiconductor light emitting device;
   a first connection member configured to electrically connect the first conductive member to the first substrate electrode; and
   a second connection member configured to electrically connect the second conductive member to the second substrate electrode,
   the light emitting unit including:
      a semiconductor stacked body including a first semiconductor layer of a first conductivity type, a second semiconductor layer of a second conductivity type, and a light emitting layer provided between the second semiconductor layer and a portion of the first semiconductor layer, the semiconductor stacked body having a first major surface on a first semiconductor layer side of the semiconductor stacked body and a second major surface on a second semiconductor layer side of the semiconductor stacked body;
      a first light emitting unit electrode electrically connected to the first semiconductor layer on a second major surface side; and
      a second light emitting unit electrode electrically connected to the second semiconductor layer on the second major surface side, the first conductive member being electrically connected to the first light emitting unit electrode and including a first columnar portion provided on the second major surface, the second conductive member being electrically connected to the second light emitting unit electrode and including a second columnar portion provided on the second major surface, the sealing member covering a side surface of the first conductive member and a side surface of the second conductive member, the optical layer being provided on the first major surface of the semiconductor stacked body, the optical layer including a wavelength conversion unit, the wavelength conversion unit being configured to absorb an emitted light emitted from the light emitting layer and emit a light having a wavelength different from a wavelength of the emitted light, a surface area of the second substrate electrode being not less than 100 times a cross-sectional area of the second columnar portion cut by a plane parallel to the second major surface.

2. The apparatus according to claim 1, wherein a surface area of the first substrate electrode and a surface area of the second substrate electrode are not less than 3 square millimeters.

3. The apparatus according to claim 1, wherein a surface area of the first substrate electrode and a surface area of the second substrate electrode are not less than 10 square millimeters.

4. The apparatus according to claim 1, wherein
the semiconductor light emitting device further includes an insulating layer provided between the first columnar portion and a portion of the second semiconductor layer on the second major surface side, and
the first columnar portion covers the portion of the second semiconductor layer on the second major surface side with the insulating layer interposed.

5. The apparatus according to claim 4, wherein the first conductive member further includes a first connection portion configured to cover at least a portion of the insulating layer and electrically connect the first light emitting unit electrode to the first columnar portion.

6. The apparatus according to claim 1, wherein the mounting substrate further includes a mounting substrate insulating layer configured to leave a portion of the second substrate electrode exposed to be connected to the second connection member while leaving a portion of the first substrate electrode exposed to be connected to the first connection member.

7. The apparatus according to claim 1, wherein the base body includes:
an insulating substrate portion, the first substrate electrode and the second substrate electrode being provided on the insulating substrate portion; and
a metal substrate portion stacked with the insulating substrate portion on a side of the insulating substrate portion opposite to the first substrate electrode and the second substrate electrode.

8. The apparatus according to claim 1, wherein a surface area of the first substrate electrode is not less than 100 times a cross-sectional area of the first columnar portion cut by a plane parallel to the second major surface.

9. The apparatus according to claim 1, wherein a surface area of the second substrate electrode is not less than 30 times a cross-sectional area of the light emitting unit cut by a plane parallel to the second major surface.

10. The apparatus according to claim 9, wherein a surface area of the first substrate electrode is not less than 30 times a cross-sectional area of the light emitting unit cut by a plane parallel to the second major surface.

11. The apparatus according to claim 1, wherein a surface area of the second substrate electrode is not less than 333 times a cross-sectional area of the second columnar portion cut by a plane parallel to the second major surface.

12. The apparatus according to claim 1, wherein a surface area of the first light emitting unit electrode is less than a surface area of the second light emitting unit electrode.

13. The apparatus according to claim 1, wherein thermal conductivities of the first substrate electrode and the second substrate electrode are higher than thermal conductivities of the first connection member and the second connection member.

14. The apparatus according to claim 1, wherein the first conductivity type is an n-type and the second conductivity type is a p-type.

15. A light source apparatus, comprising:
a semiconductor light emitting device including a light emitting unit, a first conductive member, a second conductive member, a sealing member, and an optical layer;
a mounting substrate including a base body, a first substrate electrode, and a second substrate electrode, the first substrate electrode and the second substrate electrode being provided on a surface of the base body to oppose the semiconductor light emitting device;
a first connection member configured to electrically connect the first conductive member to the first substrate electrode; and
a second connection member configured to electrically connect the second conductive member to the first substrate electrode,
the light emitting unit including:
a semiconductor stacked body including a first semiconductor layer of a first conductivity type, a second semiconductor layer of a second conductivity type, and a light emitting layer provided between the second semiconductor layer and a portion of the first semiconductor layer, the semiconductor stacked body having a first major surface on a first semiconductor layer side of the semiconductor stacked body and a second major surface on a second semiconductor layer side of the semiconductor stacked body;
a first light emitting unit electrode electrically connected to the first semiconductor layer on a second major surface side; and
a second light emitting unit electrode electrically connected to the second semiconductor layer on the second major surface side,
the first conductive member being electrically connected to the first light emitting unit electrode and including a first columnar portion provided on the second major surface,
the second conductive member being electrically connected to the second light emitting unit electrode and including a second columnar portion provided on the second major surface,
the sealing member covering a side surface of the first conductive member and a side surface of the second conductive member,
the optical layer being provided on the first major surface of the semiconductor stacked body, the optical layer including a wavelength conversion unit, the wavelength conversion unit being configured to absorb an emitted light emitted from the light emitting layer and emit a light having a wavelength different from a wavelength of the emitted light, a surface area of the second substrate electrode being not less than 30 times a cross-sectional area of the light emitting unit cut by a plane parallel to the second major surface.

16. The apparatus according to claim 15, wherein a surface area of the first substrate electrode and a surface area of the second substrate electrode are not less than 3 square millimeters.

17. The apparatus according to claim 15, wherein
the semiconductor light emitting device further includes an insulating layer provided between the first columnar portion and a portion of the second semiconductor layer on the second major surface side, and
the first columnar portion covers the portion of the second semiconductor layer on the second major surface side with the insulating layer interposed.

18. The apparatus according to claim 17, wherein the first conductive member further includes a first connection portion configured to cover at least a portion of the insulating layer and electrically connect the first light emitting unit electrode to the first columnar portion.

19. The apparatus according to claim 15, wherein the mounting substrate further includes a mounting substrate insulating layer configured to leave a portion of the second substrate electrode exposed to be connected to the second connection member while leaving a portion of the first substrate electrode exposed to be connected to the first connection member.

20. The apparatus according to claim 15, wherein the base body includes:
an insulating substrate portion, the first substrate electrode and the second substrate electrode being provided on the insulating substrate portion; and
a metal substrate portion stacked with the insulating substrate portion on a side of the insulating substrate portion opposite to the first substrate electrode and the second substrate electrode.

* * * * *